(12) United States Patent
Katou et al.

(10) Patent No.: US 8,315,087 B2
(45) Date of Patent: Nov. 20, 2012

(54) MAGNETIC RANDOM ACCESS MEMORY

(75) Inventors: Yuukou Katou, Tokyo (JP); Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 303 days.

(21) Appl. No.: 12/593,417

(22) PCT Filed: Jan. 18, 2008

(86) PCT No.: PCT/JP2008/050574
§ 371 (c)(1),
(2), (4) Date: Dec. 7, 2009

(87) PCT Pub. No.: WO2008/120482
PCT Pub. Date: Oct. 9, 2008

(65) Prior Publication Data
US 2010/0110777 A1 May 6, 2010

(30) Foreign Application Priority Data

Mar. 29, 2007 (JP) .................................. 2007-086567
Oct. 15, 2007 (JP) .................................. 2007-267765

(51) Int. Cl.
*G11C 11/00* (2006.01)
(52) U.S. Cl. ...................... 365/158; 365/171; 365/173
(58) Field of Classification Search .................. 365/158, 365/171, 173, 209, 74, 130, 225.5, 66, 55, 365/189.14
See application file for complete search history.

(56) References Cited

U.S. PATENT DOCUMENTS

| 6,775,183 | B2 * | 8/2004 | Heide ........................... 365/158 |
| 6,834,005 | B1 | 12/2004 | Parkin |
| 7,372,757 | B2 * | 5/2008 | Shin et al. .................. 365/225.5 |
| 7,859,881 | B2 * | 12/2010 | Iwata et al. ..................... 365/81 |
| 7,936,627 | B2 | 5/2011 | Fukami |
| 8,023,315 | B2 | 9/2011 | Fukami |
| 2002/0055016 | A1 | 5/2002 | Hiramoto et al. |

FOREIGN PATENT DOCUMENTS

JP 02208680 A 7/2002

(Continued)

OTHER PUBLICATIONS

S. Mizukami et al., "The Study on Ferromagnetic Resonance Linewidth for NM/80NiFe/NM (NM=Cu, Ta, Pd and Pt) Films", Jpn. J. Appl. Phys., vol. 40, pp. 580-585, 2001.

(Continued)

*Primary Examiner* — Dang Nguyen

(57) ABSTRACT

An MRAM according to the present invention has a magnetoresistance element 1. The magnetoresistance element 1 has: a first magnetic layer 10 including a first region 11 whose magnetization direction is reversible; a second magnetic layer 30 whose magnetization direction is fixed parallel to a magnetization easy axis direction of the first region 11; and a non-magnetic layer 20 sandwiched between the first magnetic layer 10 and the second magnetic layer 30. A domain wall DW is formed at least one end of the first region 11 of the first magnetic layer 10. The second magnetic layer 30 is formed to overlap with the first region and the above-mentioned one end. At a time of data writing, a write current is applied between the first magnetic layer 10 and the second magnetic layer 30.

20 Claims, 26 Drawing Sheets

FOREIGN PATENT DOCUMENTS

| | | | |
|---|---|---|---|
| JP | 2005093488 | A | 4/2005 |
| JP | 2005150303 | A | 6/2005 |
| JP | 2005191032 | A | 7/2005 |
| JP | 2006073930 | A | 3/2006 |
| JP | 2006093578 | A | 4/2006 |
| JP | 2007258460 | A | 10/2007 |
| JP | 2007317895 | A | 12/2007 |
| WO | 2007020823 | A | 2/2007 |

OTHER PUBLICATIONS

H. Numata et al., "Magnetic Configuration of a New Memory Cell Utilizing Domain Wall Motion", Intermag 2006 Digest, HQ-03.

A. Yamaguchi et al., "Real-Space Observation of Current-Driven Domain Wall Motion in Submicron Magnetic Wires", Physical Review Letters, vol. 92, No. 7, Feb. 20, 2004, 077205-1-077205-4.

International Search Report for PCT/JP2008/050574 mailed May 13, 2008.

R. Scheuerlein et al., "A 10ns Read and Write Non-Volatile Memory Array Using a Magnetic Tunnel Junction and FET Switch in each Cell", 2000 IEEE International Solid-State Circuits Conference, Digest of Technical Papers, pp. 128-129.

M. Durlam et al., "Nonvolatile RAM based on Magnetic Tunnel Junction Elements", 2000 IEEE International Solid-State Circuits Conference, Digest of Technical Papers, pp. 130-131.

K. Yagami et al., "Research Trends in Spin Transfer Magnetization Switching", Journal of the Magnetics Society of Japan, vol. 28, No. 9, 2004, pp. 937-948.

J. Shibata et al., "Effect of Spin Current on Uniform Ferromagnetism: Domain Nucleation", Physical Review Letters, Feb. 25, 2005, vol. 94, p. 076601-1-076601-4.

US Office Action for U.S. Appl. No. 12/517,981 issued Dec. 2, 2011.

* cited by examiner

MAGNETIC RANDOM ACCESS MEMORY

This application is the National Phase of PCT/JP2008/050574, filed Jan. 18, 2008, which is based upon and claims the benefit of priority from Japanese patent application No. 2007-086567, filed on Mar. 29, 2007 and Japanese patent application No. 2007-267765, filed on Oct. 15, 2007, the disclosure of which is incorporated herein in its entirely by reference.

TECHNICAL FIELD

The present invention relates to a magnetic random access memory (MRAM: Magnetic Random Access Memory). In particular, the present invention relates to an MRAM based on a spin transfer method.

BACKGROUND ART

An MRAM is a promising nonvolatile memory from a viewpoint of high integration and high-speed operation. In the MRAM, a magnetoresistance element that exhibits a "magnetoresistance effect" such as TMR (Tunnel MagnetoResistance) effect is utilized. In the magnetoresistance element, for example, a magnetic tunnel junction (MTJ: Magnetic Tunnel Junction) in which a tunnel barrier layer is sandwiched by two ferromagnetic layers is formed. The two ferromagnetic layers include a pinned layer (magnetization fixed layer) whose magnetization direction is fixed and a free layer (magnetization free layer) whose magnetization direction is reversible. For example, refer to Roy Scheuerlein et al., "A 10 ns Read and Write Non-Volatile Memory Array Using a Magnetic Tunnel Junction and FET Switch in each Cell", 2000 IEEE International Solid-State Circuits Conference, DIGEST OF TECHNICAL PAPERS, pp. 128-129.

It is known that a resistance value (R+ΔR) of the MTJ when the magnetization directions of the pinned layer and the free layer are "anti-parallel" to each other becomes larger than a resistance value (R) when the magnetization directions are "parallel" to each other due to the magnetoresistance effect. The MRAM uses the magnetoresistance element having the MTJ as a memory cell and nonvolatilely stores data by utilizing the change in the resistance value. Data writing to the memory cell is performed by switching the magnetization direction of the free layer.

Conventionally known methods of data writing to the MRAM include an asteroid method (for example, refer to M. Durlam et al., "Nonvolatile RAM based on Magnetic Tunnel Junction Elements", 2000 IEEE International Solid-State Circuits Conference, DIGEST OF TECHNICAL PAPERS, pp. 130-131). According to the asteroid method, a magnetic switching field necessary for switching the magnetization of the free layer increases in substantially inverse proportion to a size of the memory cell. That is to say, a write current tends to increase with the miniaturization of the memory cell.

As a write method capable of suppressing the increase in the write current with the miniaturization, there is proposed a "spin transfer method" (for example, refer to Yagami and Suzuki, Research Trends in Spin Transfer Magnetization Switching, Journal of The Magnetics Society of Japan, Vol. 28, No. 9, 2004). According to the spin transfer method, a spin-polarized current is injected to a ferromagnetic conductor, and direct interaction between spin of conduction electrons of the current and magnetic moment of the conductor causes the magnetization to be switched (hereinafter referred to as "spin transfer magnetization switching"). The spin transfer magnetization switching will be outlined below with reference to FIG. 1.

In FIG. 1, a magnetoresistance element is provided with a free layer 101, a pinned layer 103 and a tunnel barrier layer 102 that is a nonmagnetic layer sandwiched between the free layer 101 and the pinned layer 103. Here, the pinned layer 103, whose magnetization orientation is fixed, is so formed as to be thicker than the free layer 101 and serves as a spin filter, i.e. a mechanism for generating the spin-polarized current. A state in which the magnetization directions of the free layer 101 and the pinned layer 103 are parallel to each other is related to data "0", while a state in which they are anti-parallel to each other is related to data "1".

The spin transfer magnetization switching shown in FIG. 1 is achieved by a CPP (Current Perpendicular to Plane) method, where a write current is injected in a direction perpendicular to the film surface. More specifically, the current flows from the pinned layer 103 to the free layer 101 in a transition from data "0" to data "1". In this case, electrons having the same spin state as that of the pinned layer 103 being the spin filter move from the free layer 101 to the pinned layer 103. As a result of the spin transfer (transfer of spin angular momentum) effect, the magnetization of the free layer 101 is switched. On the other hand, the current direction is reversed and the current flows from the free layer 101 to the pinned layer 103 in a transition from data "1" to data "0". In this case, electrons having the same spin state as that of the pinned layer 103 being the spin filter move from the pinned layer 103 to the free layer 101. As a result of the spin transfer effect, the magnetization of the free layer 101 is switched.

In this manner, the data writing is performed by transferring the spin electrons in the spin transfer magnetization switching. It is possible to set the magnetization direction of the free layer 101 depending on the direction of the spin-polarized current perpendicular to the film surface. Here, it is known that the threshold value of the writing (magnetization switching) depends on current density. Therefore, the write current necessary for the magnetization switching decreases with the reduction of the size of the memory cell. Since the write current is decreased with the miniaturization of the memory cell, the spin transfer magnetization switching is important in realizing a large-capacity MRAM.

A magnetoresistance element described in Japanese Laid-Open Patent Application JP-2005-150303 includes a ferromagnetic tunnel junction having a three-layer structure consisting of a first ferromagnetic layer, a tunnel barrier layer and a second ferromagnetic layer. The first ferromagnetic layer is larger in coercivity than the second ferromagnetic layer. Magnetization of an end of the second ferromagnetic layer is fixed in a direction having a component perpendicular to a magnetization easy axis direction of the second ferromagnetic layer.

A magnetic storage device described in Japanese Laid-Open Patent Application JP-2005-191032 has a laminated structure consisting of a magnetization fixed layer, a tunnel insulating layer and a magnetization free layer. The magnetization free layer has a connector section overlapping with the tunnel insulating layer and the magnetization fixed layer, constricted sections adjacent to both ends of the connector section, and a pair of magnetization fixed sections respectively formed adjacent to the constricted sections. The magnetization fixed sections are respectively provided with fixed magnetizations whose directions are opposite to each other. At a time of data writing, a write current penetrating through the connector section, the pair of constricted sections and the pair of magnetization fixed sections of the magnetization free layer flows. A domain wall moves between the pair of constricted sections depending on a direction of the write current.

A magnetic memory element described in Japanese Laid-Open Patent Application JP-2006-73930 has a first magnetic layer, an intermediate layer and a second magnetic layer. Data is recorded as magnetization directions of the first magnetic layer and the second magnetic layer. Magnetic domains whose magnetization directions are anti-parallel to each other and a domain wall separating the magnetic domains are steadily formed in the first magnetic layer. The domain wall moves within the first magnetic layer due to an in-plane current flowing in the first magnetic layer.

DISCLOSURE OF INVENTION

An object of the present invention is to provide a spin transfer type MRAM that can reduce the write current.

According to an exemplary embodiment of the present invention, a spin transfer type magnetic random access memory is provided. The magnetic random access memory has a magnetoresistance element and a current supply section configured to supply a current to the magnetoresistance element. The magnetoresistance element has: a first magnetic layer including a first region whose magnetization direction is reversible; a second magnetic layer whose magnetization direction is fixed parallel to a magnetization easy axis direction of the first region; and a non-magnetic layer sandwiched between the first magnetic layer and the second magnetic layer. A domain wall is formed at least one end of the first region of the first magnetic layer. The second magnetic layer is so formed as to overlap with at least a part of the first region and at least a part of the above-mentioned one end.

When switching the magnetization direction of the first region, the current supply section applies a write current between the first magnetic layer and the second magnetic layer. The magnetization direction of the first region of the first magnetic layer is switched due to the spin transfer. Here, the above-mentioned domain wall includes magnetization whose direction is different from the magnetization easy axis direction and thus is more susceptible to the spin torque than the other portion. That is to say, the magnetization reversal occurs more easily at the domain wall position. When the magnetization reversal occurs at the domain wall position, a new domain wall is formed at the adjacent position. As a result of repetition of this phenomenon, the domain wall goes through the first region from one end to the other end. Consequently, the magnetization direction of the first region is switched.

As described above, the first magnetic layer has the domain wall that is susceptible to the spin torque. Therefore, the magnetization of the first region of the first magnetic layer can be switched more easily as compared with a case where no domain wall exists. In other words, the spin transfer magnetization switching in the first magnetic layer occurs more easily. It is thus possible to reduce the write current and reduce power consumption.

BEST MODE FOR CARRYING OUT THE INVENTION

A magnetoresistance element and an MRAM using the magnetoresistance element as a memory cell according to an exemplary embodiment of the present invention will be described below with reference to the attached drawings.

Figure 1:
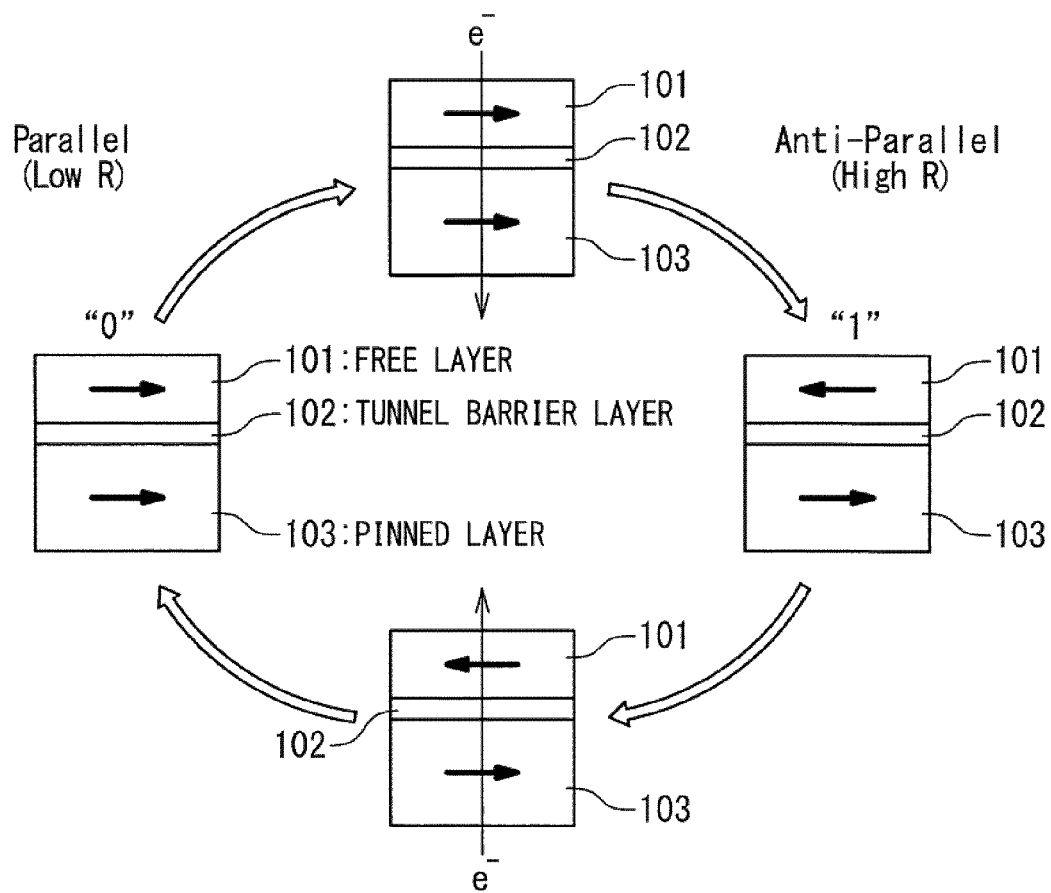
FIG. 1 is a diagram for explaining data writing based on a spin transfer method.
Figure 2:
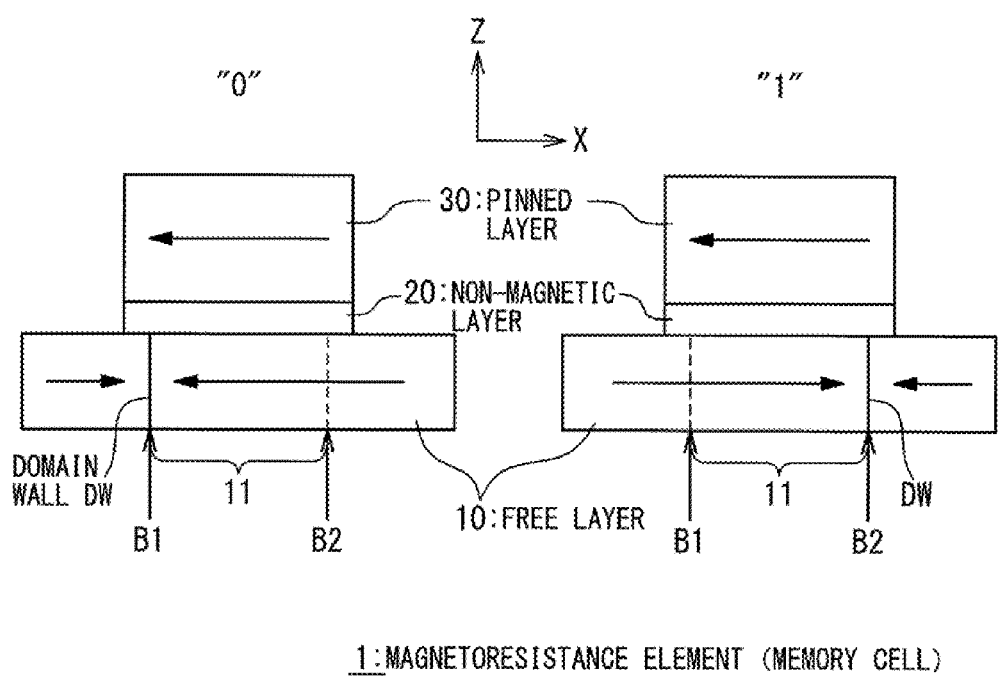
FIG. 2 is a side view schematically showing a structure of a magnetoresistance element (memory cell) according to an exemplary embodiment of the present invention.

First of all, let us explain a basic structure and principle of the magnetoresistance element according to the present exemplary embodiment. FIG. 2 schematically shows a structure of the magnetoresistance element (memory cell) 1 according to the present exemplary embodiment. The magnetoresistance element 1 has a free layer 10, a non-magnetic layer 20 and a pinned layer 30. The free layer 10 and the pinned layer 30 are magnetic layers each having a spontaneous magnetization. The non-magnetic layer 20, which is a thin tunnel insulating film for example, is sandwiched between the free layer 10 (first magnetic layer) and the pinned layer 30 (second magnetic layer). The free layer 10, the non-magnetic layer 20 and the pinned layer 30 constitute an MTJ.

As shown in FIG. 2, a direction in which the free layer 10, the non-magnetic layer 20 and the pinned layer 30 are laminated is defined as a "Z direction". Each layer is formed parallel to a XY plane perpendicular to the Z direction.

The free layer 10 includes a magnetization switching region 11 whose magnetization direction is reversible. In FIG. 2, a magnetization easy axis direction of the magnetization switching region 11 is in parallel to the X direction. That is, the magnetization direction of the magnetization switching region 11 is allowed to be the +X direction or the −X direction. On the other hand, the magnetization direction of the pinned layer 30 is fixed in parallel to the above-mentioned magnetization easy axis direction (X direction) at least at the time of data reading and writing. For example, as shown in FIG. 2, the magnetization direction of the pinned layer 30 is fixed in the −X direction. The magnetization of the pinned layer 30 may be fixed at the time of device manufacturing or may be fixed at the time of data reading and writing.

The pinned layer 30 is so formed as to overlap with at least a part of the magnetization switching region 11 of the free layer 10. When the magnetization direction of the magnetization switching region 11 is the −X direction, namely, when the magnetization directions of the magnetization switching region 11 and the pinned layer 30 are "parallel" to each other, a resistance value of the magnetoresistance element 1 is comparatively small. On the other hand, when the magnetization direction of the magnetization switching region 11 is the +X direction, namely, when the magnetization directions of the magnetization switching region 11 and the pinned layer 30 are "anti-parallel" to each other, the resistance value of the magnetoresistance element 1 is comparatively large. For example, the parallel state is related to data "0" and the anti-parallel state is related to data "1".

Furthermore, the free layer 10 has a domain wall DW. As shown in FIG. 2 for example, in the case of data "0", the domain wall DW is formed at a position B1 that is one end of the magnetization switching region 11. On the other hand, in the case of data "1", the domain wall DW is formed at a position B2 that is the other end of the magnetization switching region 11. A means for forming the domain wall DW will be described later. It can be said that the magnetoresistance element 1 (memory cell) shown in FIG. 2 memorizes data by the position of the domain wall DW within the free layer 10. Note that an aspect of the domain wall DW in the free layer 10 is not limited to the example shown in FIG. 2. What is important is that the free layer 10 has at least one domain wall DW. The pinned layer 30 is so formed as to overlap with at least a part of the position B1, B2 of the domain wall DW. This overlapping includes a case where an end of the pinned layer 30 is aligned with the formation position B1, B2 of the domain wall DW.

Figure 3:
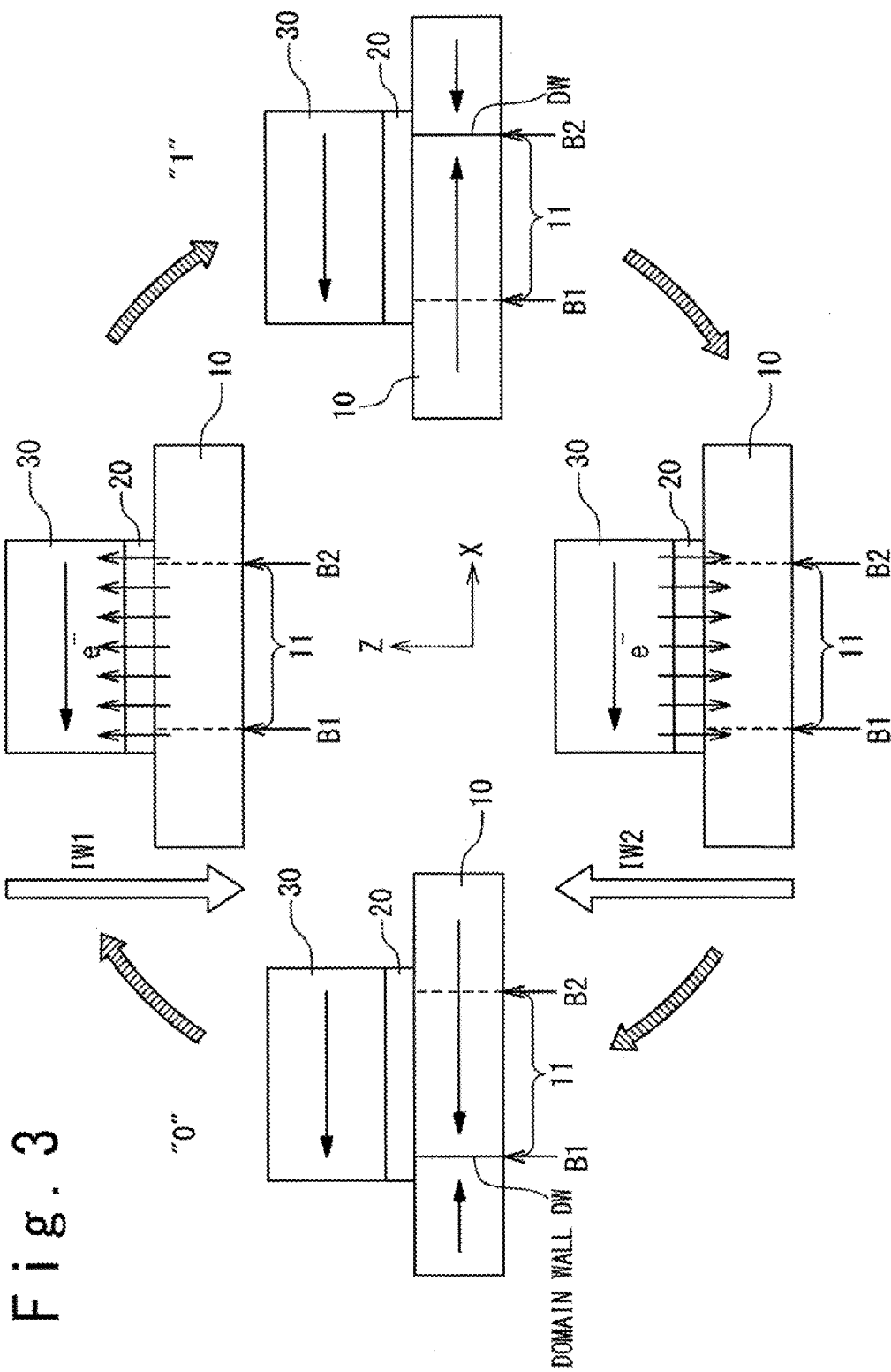
FIG. 3 is a diagram for explaining data writing based on a spin transfer method according to the exemplary embodiment of the present invention.

Next, the data writing to the magnetoresistance element 1 will be described below with reference to FIG. 3. The data writing according to the present exemplary embodiment is achieved by the CPP (Current Perpendicular to Plane) type spin transfer magnetization switching. That is, a write current is applied between the free layer 10 and the pinned layer 30 through the non-magnetic layer 20. The magnetization direction of the magnetization switching region 11 of the free layer 10 is switched due to the spin transfer effect.

More specifically, in a transition from data "0" to data "1", a write current IW1 flows from the pinned layer 30 to the free layer 10. In this case, electrons having the same spin state as that of the pinned layer 30 move from the free layer 10 to the pinned layer 30. As a result of the spin transfer effect, the magnetization of the magnetization switching region 11 of the free layer 10 is switched to be directed to the +X direction. On the other hand, in a transition from data "1" to data "0", a write current IW2 flows from the free layer 10 to the pinned layer 30. In this case, electrons having the same spin state as that of the pinned layer 30 move from the pinned layer 30 to the free layer 10. As a result of the spin transfer effect, the magnetization of the magnetization switching region 11 of the free layer 10 is switched to be directed to the −X direction.

Figure 4:
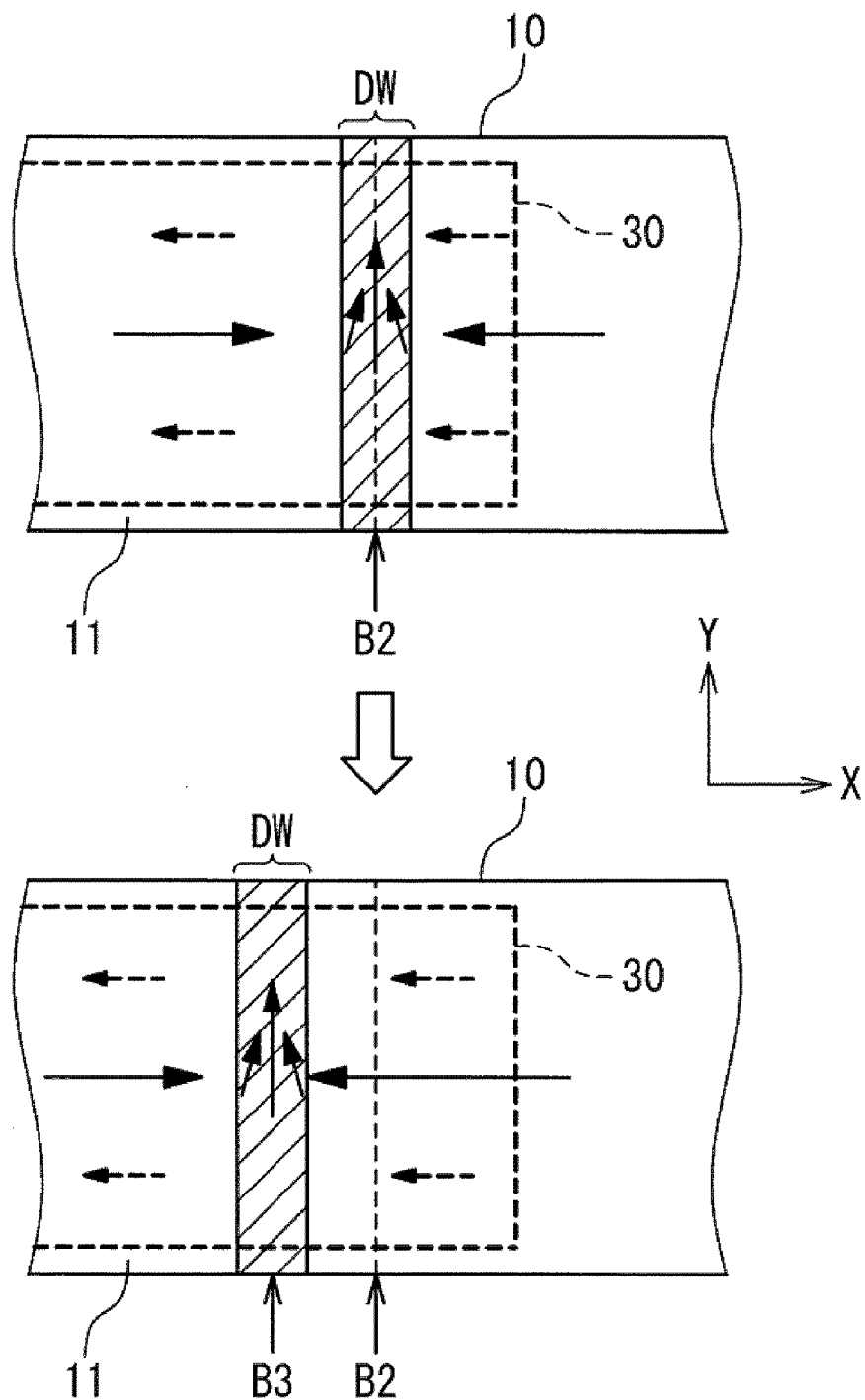
FIG. 4 is a plan view for explaining domain wall motion in the exemplary embodiment of the present invention.

The data writing according to the present exemplary embodiment will be described in more detail with reference to FIG. 4. FIG. 4 is a plan view showing around the position B2 of the free layer 10 in closeup. A position and magnetization of the pinned layer 30 also are indicated by dashed lines. In the data "1" state, the domain wall DW exists at the position B2. At the time of the transition from data "1" to data "0", the −X direction spin electrons are injected from the pinned layer 30 into the free layer 10. As mentioned above, the pinned layer 30 overlaps with the magnetization switching region 11 and at least a part of the position B2 of the domain wall DW. Therefore, the spin electrons are injected into the magnetization switching region 11 and the position B2 of the domain wall DW.

At this time, magnetization perpendicular to the −X direction is most susceptible to spin torque given by the −X direction spin electrons. As shown in FIG. 4, there exists the Y direction magnetization component perpendicular to the magnetization easy axis direction (X direction) within the domain wall DW. Therefore, the magnetization within the domain wall DW is more susceptible to the spin torque than the magnetization of the other portion. That is to say, when the spin electrons are injected into the free layer 10, the magnetization at the position of the domain wall DW is first directed to the −X direction. As a result, a new domain wall DW is formed at a position B3 as shown in FIG. 4. This appears that the domain wall DW moves from the position B2 to the position B3.

When the spin electrons are further injected, the position of the domain wall DW further shifts to the −X direction. As a result of repetition of this phenomenon, the domain wall DW continuously moves toward the −X direction. In this manner, the magnetization reversal of the magnetization switching region 11 first starts at the initial position B2 of the domain wall DW and then proceeds to the −X direction from the initial position B2. In accordance with this, the domain wall DW moves toward the −X direction within the magnetization switching region 11. By the domain wall DW going through the magnetization switching region 11, the magnetization direction of whole of the magnetization switching region 11 is reversed. The same applies to the transition from data "1" to data "0".

As described above, according to the present exemplary embodiment, the free layer 10 has the domain wall DW that is susceptible to the spin torque. As a result, the magnetization of the magnetization switching region 11 can be switched more easily as compared with a case where no domain wall DW exists. In other words, the spin transfer magnetization switching in the free layer 10 occurs more easily. It is thus possible to reduce the write current IW1, IW2 and reduce power consumption.

Figure 5:
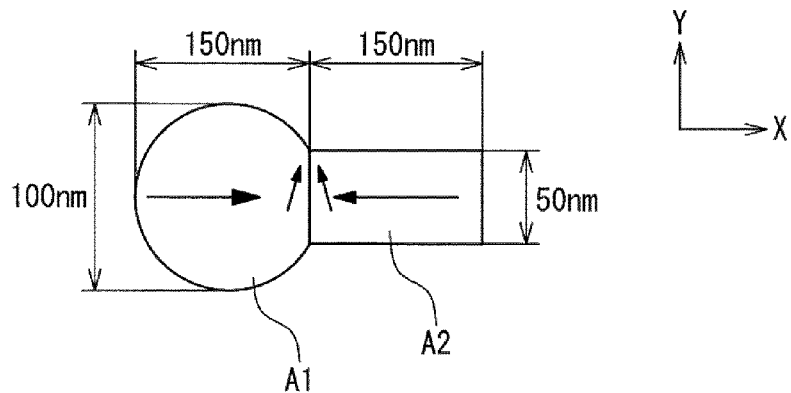
FIG. 5 is a diagram for explaining effects of the exemplary embodiment of the present invention.

The inventor of the present application verified the reduction in the write current through simulation. FIG. 5 is a plan view showing a structure of the free layer used in the simulation. In FIG. 5, an elliptical portion A1 corresponds to a conventional free layer. In order to form a domain wall, a rectangular portion A2 whose magnetization direction is fixed in the −X direction is connected to the elliptical portion A1. The magnetization direction of the elliptical portion A1 is set in the +X direction and a domain wall is formed at a boundary between the elliptical portion A1 and the rectangular portion A2. The write current value required for switching the magnetization of the elliptical portion A1 is as follows. For comparison, in a case of the conventional free layer, namely, in a case where the free layer has only the elliptical portion A1, the write current value is "1". In the case of the free layer of the present exemplary embodiment, namely, in the case where the free layer has the elliptical portion A1 and the rectangular portion A2, the write current value is "0.27". In this manner, it was verified that the write current is reduced because the free layer has the domain wall.

A method of reading data from the magnetoresistance element 1 (memory cell) is exemplified as follows. Referring to FIG. 2 again, at the time of data reading, a predetermined voltage is applied between the free layer 10 and the pinned layer 30 to flow a read current. Magnitude of the read current or a read voltage corresponding to the read current varies depending on the resistance value of the magnetoresistance element 1. Therefore, the data stored in the magnetoresistance element 1 can be determined by comparing the read current or the read voltage with a predetermined reference value. It should be noted that the magnitude of the read current is designed so as not to switch the magnetization of the magnetization switching region 11.

Various exemplary embodiments of the present invention will be described below in detail.

1. FIRST EXEMPLARY EMBODIMENT

1-1. Structure

Figure 6:
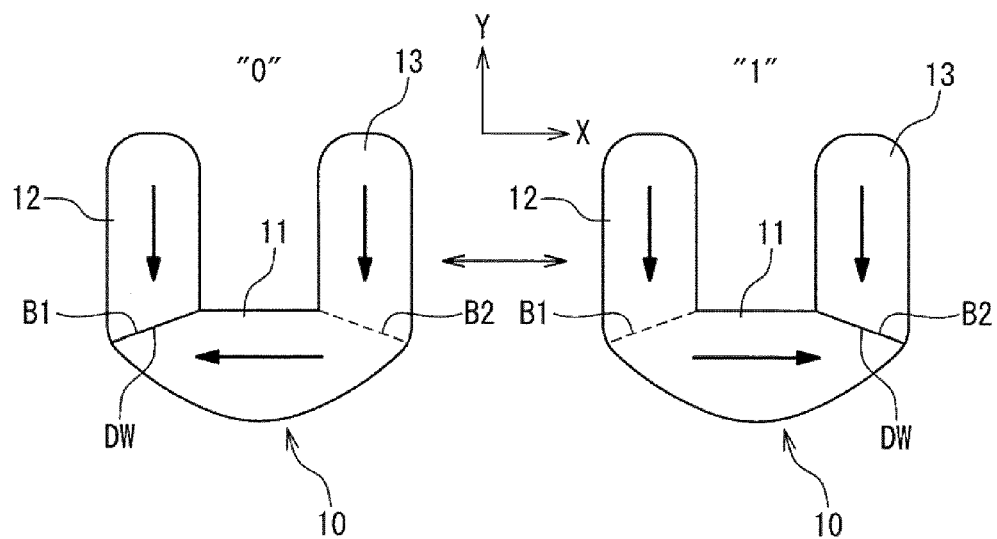
FIG. 6 is a plan view showing a structure of a free layer of the magnetoresistance element according to a first exemplary embodiment of the present invention.

FIG. 6 shows a planar shape of the free layer 10 in the first exemplary embodiment. In the present exemplary embodiment, the free layer 10 includes magnetization fixed regions 12 and 13 in addition to the magnetization switching region 11. The magnetization fixed region 12 is connected to one end B1 of the magnetization switching region 11, and the magnetization fixed region 13 is connected to the other end B2 of the magnetization switching region 11. The magnetization easy axis of the magnetization switching region 11 is along the X direction, and magnetization easy axes of the magnetization fixed regions 12 and 13 are along the Y direction. That is to say, the magnetization switching region 11 and the magnetization fixed regions 12 and 13 are arranged to be U-shape.

Magnetizations of the magnetization fixed regions 12 and 13 are both fixed in the same direction parallel to the Y direction. Here, being fixed means that the magnetization direction is substantially unchanged irrespective of data. In FIG. 6, the magnetization directions of the magnetization fixed regions 12 and 13 are both fixed in the −Y direction. The magnetization directions of the magnetization fixed regions 12 and 13 can be fixed, for example, by applying an external magnetic field of about 500 Oe in the −Y direction at the time of device manufacturing.

In a case where the magnetization direction of the magnetization switching region 11 is in the −X direction (data "0"), the domain wall DW is formed at the boundary B1 between the magnetization switching region 11 and the magnetization fixed region 12. On the other hand, in a case where the magnetization direction of the magnetization switching region 11 is in the +X direction (data "1"), the domain wall DW is formed at the boundary B2 between the magnetization switching region 11 and the magnetization fixed region 13.

At the time of data writing, the domain wall DW moves between the boundaries B1 and B2 depending on the direction of the write current. At this time, since the magnetization directions of the magnetization fixed regions 12 and 13 are fixed, the domain wall DW hardly intrudes into the magnetization fixed regions 12 and 13. That is, the motion of the domain wall DW almost stops at the boundaries B1 and B2 that are both ends of the magnetization switching region 11. In order to prevent the domain wall DW from intruding into the magnetization fixed regions 12 and 13, widths of the magnetization fixed regions 12 and 13 may be designed larger than a width of the magnetization switching region 11. Aspect ratios of the magnetization fixed regions 12 and 13 may be designed high such that sufficient magnetic anisotropy can be obtained.

It should be noted that energy of the domain wall DW becomes lower as a cross-sectional area of a magnetic body becomes smaller. It is therefore preferable that the magnetization switching region 11 is formed thicker at its central portion as shown in FIG. 6. In other words, cross-sectional areas of the magnetization switching region 11 at the boundaries B1 and B2 are preferably smaller than a cross-sectional area thereof between the boundaries B1 and B2. Consequently, the energy of the domain wall DW takes a local minimum value at the boundaries B1 and B2 and thus the domain wall DW is most stabilized at the boundaries B1 and B2. Even if the domain wall DW moves measurably due to thermal disturbance, the domain wall DW returns back to the original position B1 or B2.

The pinned layer 30 (not shown) is so formed as to overlap with at least a part of the magnetization switching region 11 and the boundaries B1 and B2. In the present exemplary embodiment, for example, a planar shape of the pinned layer 30 is almost the same as the planar shape of the free layer 10 shown in FIG. 6.

Figure 7:
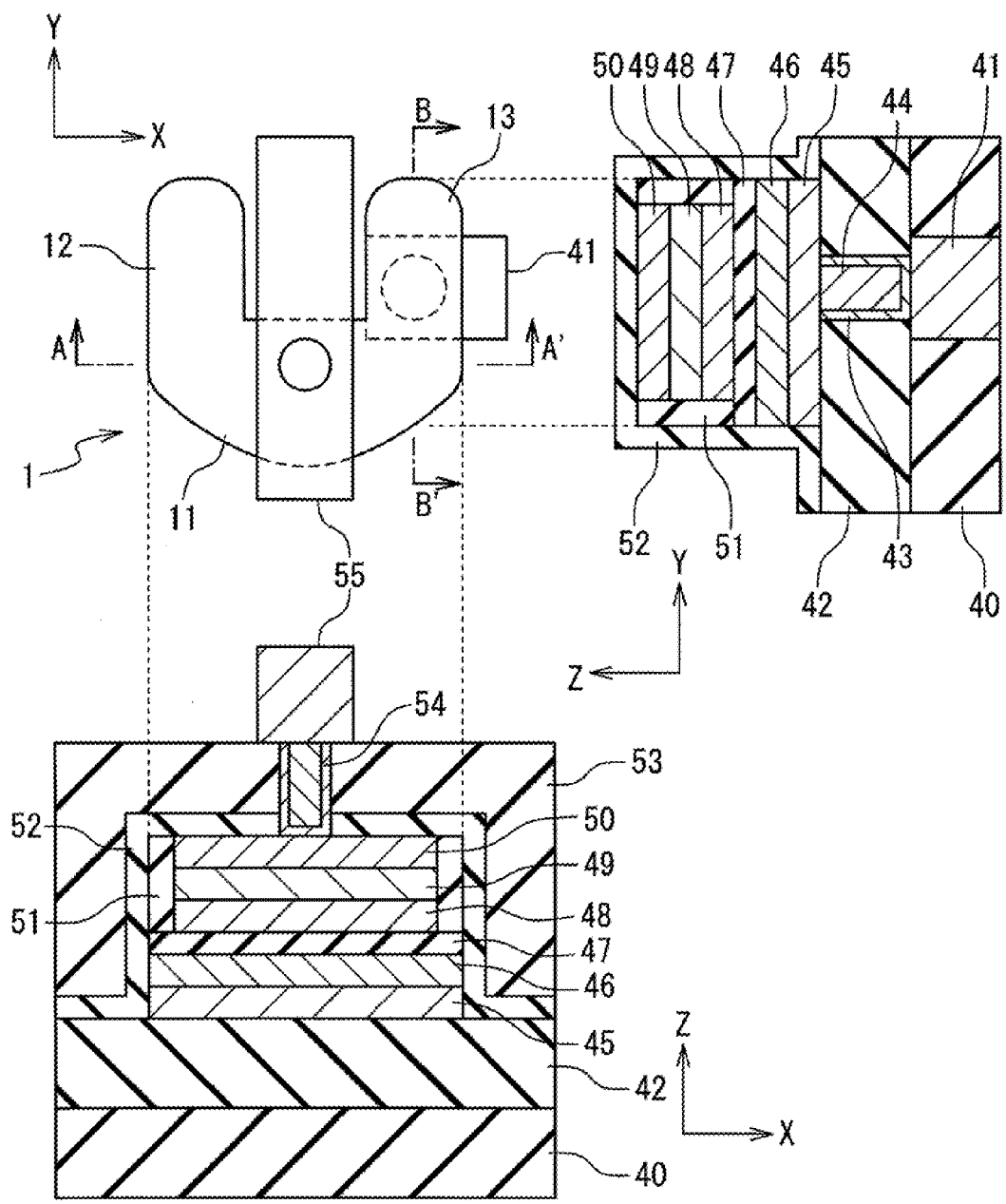
FIG. 7 is a plan view and a cross-sectional view showing a structure of the magnetoresistance element according to the first exemplary embodiment.

FIG. 7 shows one example of a plan-view structure and cross-sectional structures of the magnetoresistance element 1 according to the present exemplary embodiment. Cross-sectional structures along a line A-A' and a line B-B' in the figure are shown. One example of a method of manufacturing the magnetoresistance element 1 according to the present exemplary embodiment will be described with reference to FIG. 7.

Transistors and interconnections are formed on a semiconductor substrate and then an interlayer insulating film 40 is formed on the semiconductor substrate. A lower interconnection 41 is formed in the interlayer insulating film 40. Next, an interlayer insulating film 42 is blanket deposited and a through-hole is formed to penetrate through the interlayer insulating film 42. A Ta film 43 (20 nm) as seed is formed in the through-hole by sputtering. Moreover, a Cu film 44 (1 μm) is formed by anodic oxidation and then CMP (Chemical Mechanical Polishing) is performed. As a result, a Cu plug is formed in the through-hole.

Next, a Ta film 45 (20 nm) is blanket deposited. A NiFe film 46 (1.5 nm) to be the free layer 10 if formed on the Ta film 45. A MgO film 47 (1 nm) to be the tunnel insulating film 20 is formed on the NiFe film 46. A CoFe film 48 (5 nm) to be the pinned layer 30 is formed on the MgO film 47. Further, a PtMn film 49 (20 nm) is formed as an antiferromagnetic layer for fixing the magnetization of the pinned layer 30. A Ta film 50 (20 nm) is formed on the PtMn film 49. Next, annealing (temperature: 275 degrees centigrade, magnetic field: about 1 T, time: 30 minutes) is performed so that the magnetization direction of the pinned layer 30 is set. In the present example, the magnetization direction of the pinned layer 30 is set in the −X direction.

Next, a resist mask having a predetermined pattern is formed by a photolithographic method. By a RIE (Reactive Ion Etching) using the resist mask, the Ta film 50 is processed to a desired planar shape. After the resist mask is removed, milling and RIE are performed by the use of the Ta film 50 as a mask so that the PtMn film 49 and the CoFe film 48 are processed to a desired planar shape. After that, a SiN film 51 (10 nm) is blanket deposited for preventing oxidation.

Next, the MgO film 47, the NiFe film 46 and the Ta film 45 are processed to a desired planar shape with protecting side surfaces of the films 48 to 50 by the SiN film 51. After that, a SiN film 52 (20 nm) is blanket deposited for preventing oxidation. Further, an interlayer insulating film 53 (400 nm) is blanket deposited by CVD (Chemical Vapor Deposition). After CMP is performed, the interlayer insulating film 53 and the SiN film 52 in a partial region are removed by a RIE so that a through-hole that reaches the Ta film 50 is formed. A Cu plug 54 is formed in the through-hole in a manner similar to that described above. Then, an upper interconnection 55 is so formed as to be connected to the Cu plug 54.

In FIG. 7, the lower interconnection 41 is connected to the magnetization fixed region 13 of the free layer 10 through the Cu plug. On the other hand, the upper interconnection 55 is connected to the pinned layer 30 through the Cu plug 54 and so forth. At the time of data writing and data reading, a current is applied between the free layer 10 and the pinned layer 30 by using these lower interconnection 41 and upper interconnection 55.

1-2. Circuit Configuration and Operation

Figure 8:
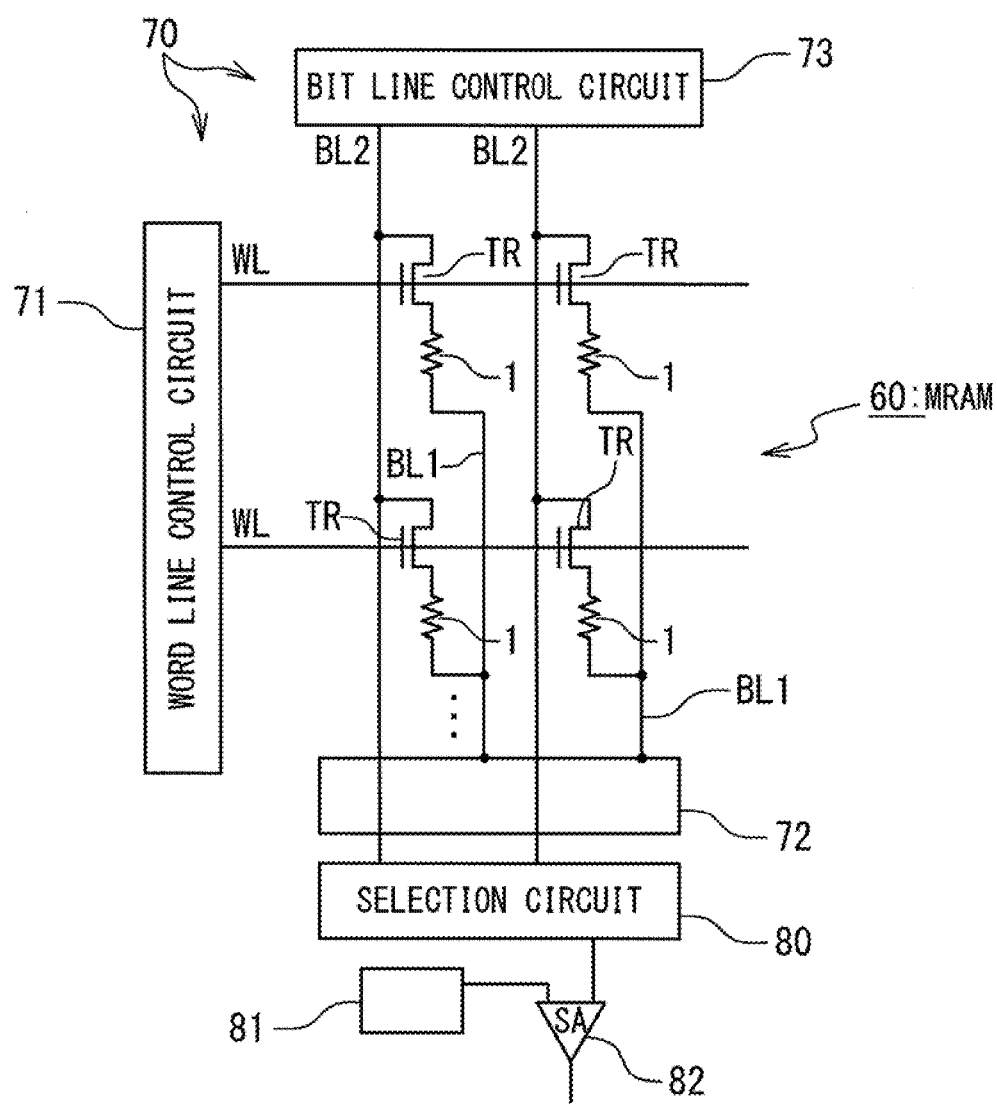
FIG. 8 is a block diagram schematically showing a circuit configuration of the MRAM according to the first exemplary embodiment.

FIG. 8 schematically shows a circuit configuration of an MRAM 60 according to the present exemplary embodiment. The MRAM 60 has a plurality of magnetoresistance elements (memory cells) 1 arranged in an array form, a word line control circuit 71, a potential application circuit 72, a bit line control circuit 73, a selection circuit 80, a reference potential generation circuit 81 and a differential sense amplifier 82.

The lower interconnection 41 of each magnetoresistance element 1 is connected to a first bit line BL1, and its upper interconnection 55 is connected to the second bit line BL2 through a selection transistor TR. One of source/drain of the selection transistor TR is connected to the magnetoresistance element 1 and the other thereof is connected to the second bit line BL2. A gate of the selection transistor TR is connected to a word line WL. The word line WL is connected to the word line control circuit 71. The first bit line BL1 is connected to the potential application circuit 72. The second bit line BL2 is connected to the bit line control circuit 73 and the selection circuit 80. An extending direction of the word line WL and an extending direction of the bit lines BL1 and BL2 are perpendicular to each other.

A data write operation is as follows. The word line control circuit 71 drives a target word line WL to turn ON the selection transistor TR. The potential application circuit 72 and the bit line control circuit 73 apply a predetermined potential difference between a target first bit line BL1 and a target second bit line BL2. As a result, the write current (e.g. 500 μA) flows between the free layer 10 and the pinned layer 30 of the magnetoresistance element 1. The potential application circuit 72 and the bit line control circuit 73 control the direction of the write current depending on the write data. It can be said that the word line control circuit 71, the potential application circuit 72 and the bit line control circuit 73 constitute a "current supply section 70" for supplying the current to the magnetoresistance element 1.

A data read operation is as follows. The word line control circuit 71 drives a target word line WL to turn ON the selection transistor TR. The potential application circuit 72 sets a potential of a target first bit line BL1 to 0 V. The bit line control circuit 73 applies a predetermined read current (e.g. 20 μA) from a target second bit line BL2 to the first bit line BL1 through the magnetoresistance element 1. At this time, a potential of the second bit line BL2 varies depending on the resistance value of the magnetoresistance element 1. For example, the potential of the second bit line BL2 becomes 0.21 V in the case of the data "0" sate while 0.41 V in the case of the data "1" state. The selection circuit 80 connects the target second bit line BL2 with the sense amplifier 82. Whereas, the reference potential generation circuit 81 outputs a reference potential (e.g. 0.3 V) to the sense amplifier 82. The sense amplifier 82 makes a comparison between the potential of the second bit line BL2 and the reference potential to sense the resistance value of the magnetoresistance element 1, namely the data stored in the memory cell 1. It should be noted that the read current is designed smaller than the above-mentioned write current in order to prevent the magnetization reversal at the time of data reading.

1-3. Modified Example

Figure 9:
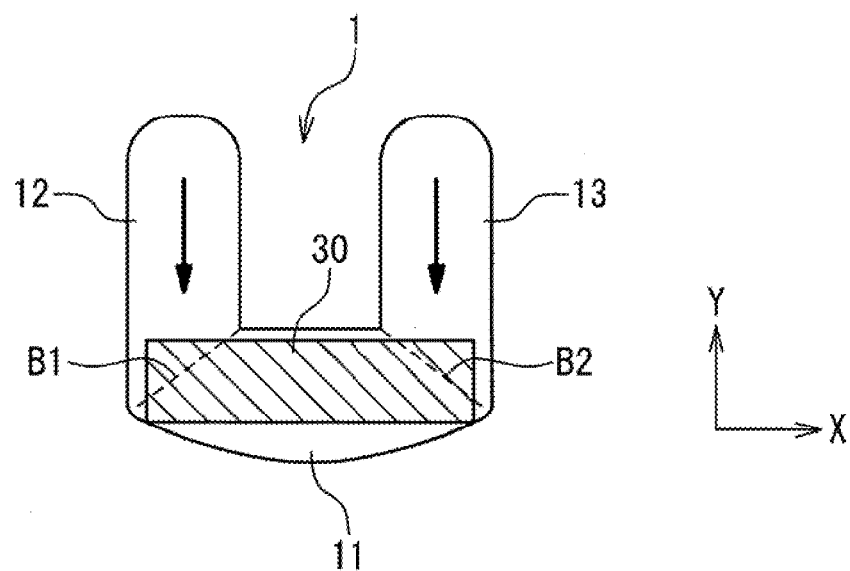
FIG. 9 is a plan view showing a modified example of the magnetoresistance element according to the first exemplary embodiment.

There is no need for the pinned layer 30 to have the same planar shape as the free layer 10. As show in FIG. 9, the pinned layer 30 may cover parts of the magnetization switching region 11, the magnetization fixed regions 12, 13 and the boundaries B1 and B2. In this case, a total amount of the write current can be reduced. Moreover, the write current flowing in the magnetization fixed regions 12 and 13 can be reduced.

Figure 10:
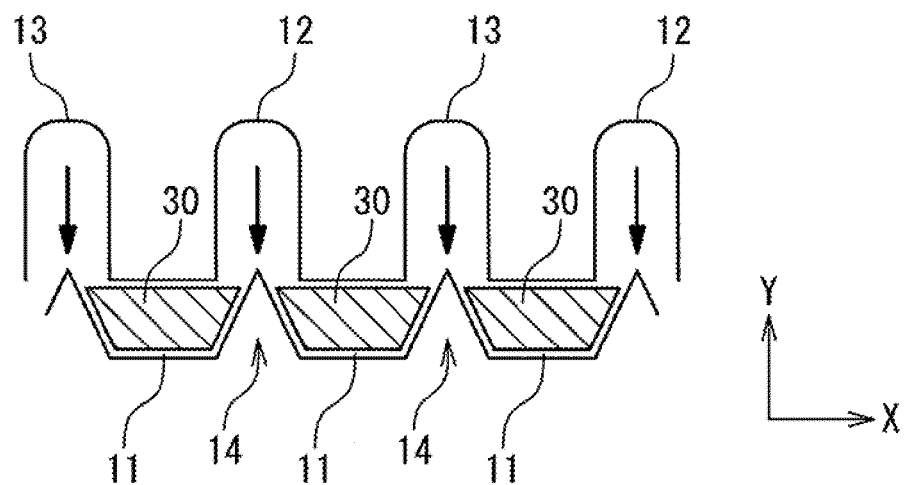
FIG. 10 is a plan view showing another modified example of the magnetoresistance element according to the first exemplary embodiment.

Moreover, since respective free layers 10 of the plurality of magnetoresistance elements 1 arranged in the bit line direction have a common potential, it is possible to interconnect those free layers 10. In a case where the free layer 10 of each magnetoresistance element 1 have the U-shape and the pinned layer 30 covers a part of the free layer 10, for example, an arrangement as shown in FIG. 10 is possible. In FIG. 10, the magnetization fixed region 12 or the magnetization fixed region 13 is shared by the magnetoresistance elements 1 which are adjacent to each other in the bit line direction. As a result, integration of the memory cells is improved. It should be noted in FIG. 10 that a constricted portion 14 is formed between adjacent free layers 10 (magnetization switching regions 11) so as to prevent the domain wall DW from intruding into the adjacent free layer 10.

2. SECOND EXEMPLARY EMBODIMENT

2-1. Structure

Figure 11:
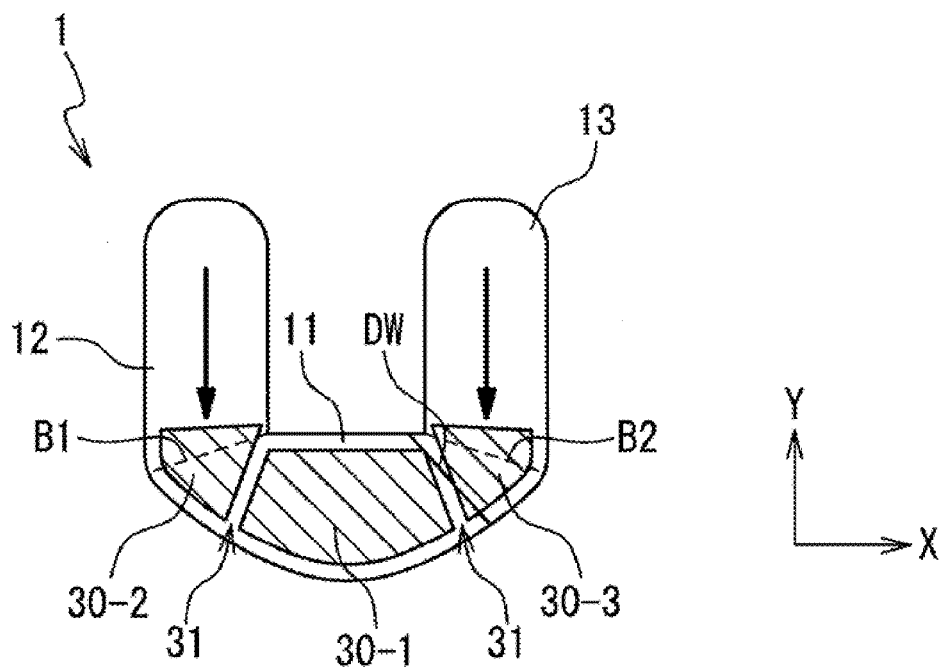
FIG. 11 is a plan view showing a structure of the magnetoresistance element according to a second exemplary embodiment of the present invention.

FIG. 11 is a plan view showing a structure of the magnetoresistance element 1 according to a second exemplary embodiment of the present invention. In the present exemplary embodiment, the same reference numerals are given to the same components as those described in the first exemplary embodiment, and an overlapping description will be omitted as appropriate.

According to the present exemplary embodiment, the pinned layer 30 is divided into a plurality of magnetic bodies. In FIG. 11, for example, the pinned layer 30 consists of a first magnetic body 30-1, a second magnetic body 30-2 and a third magnetic body 30-3. The first magnetic body 30-1 overlaps with a part of the magnetization switching region 11 of the free layer 10. The second magnetic body 30-2 overlaps with the boundary B1 between the magnetization switching region 11 and the magnetization fixed region 12. The third magnetic body 30-3 overlaps with the boundary B2 between the magnetization switching region 11 and the magnetization fixed region 13. The first magnetic body 30-1 does not overlap with the boundaries B1 and B2.

A gap 31 is formed between the first magnetic body 30-1 and the second magnetic body 30-2. Also, a gap 31 is formed between the first magnetic body 30-1 and the third magnetic body 30-3. A width of the gap 31 is about 0.25 μm, for example. It is desirable that an extending direction of the gap 31 is different from an extending direction of the domain wall DW such that the spin electrons are continuously supplied to the domain wall DW.

Figure 12:
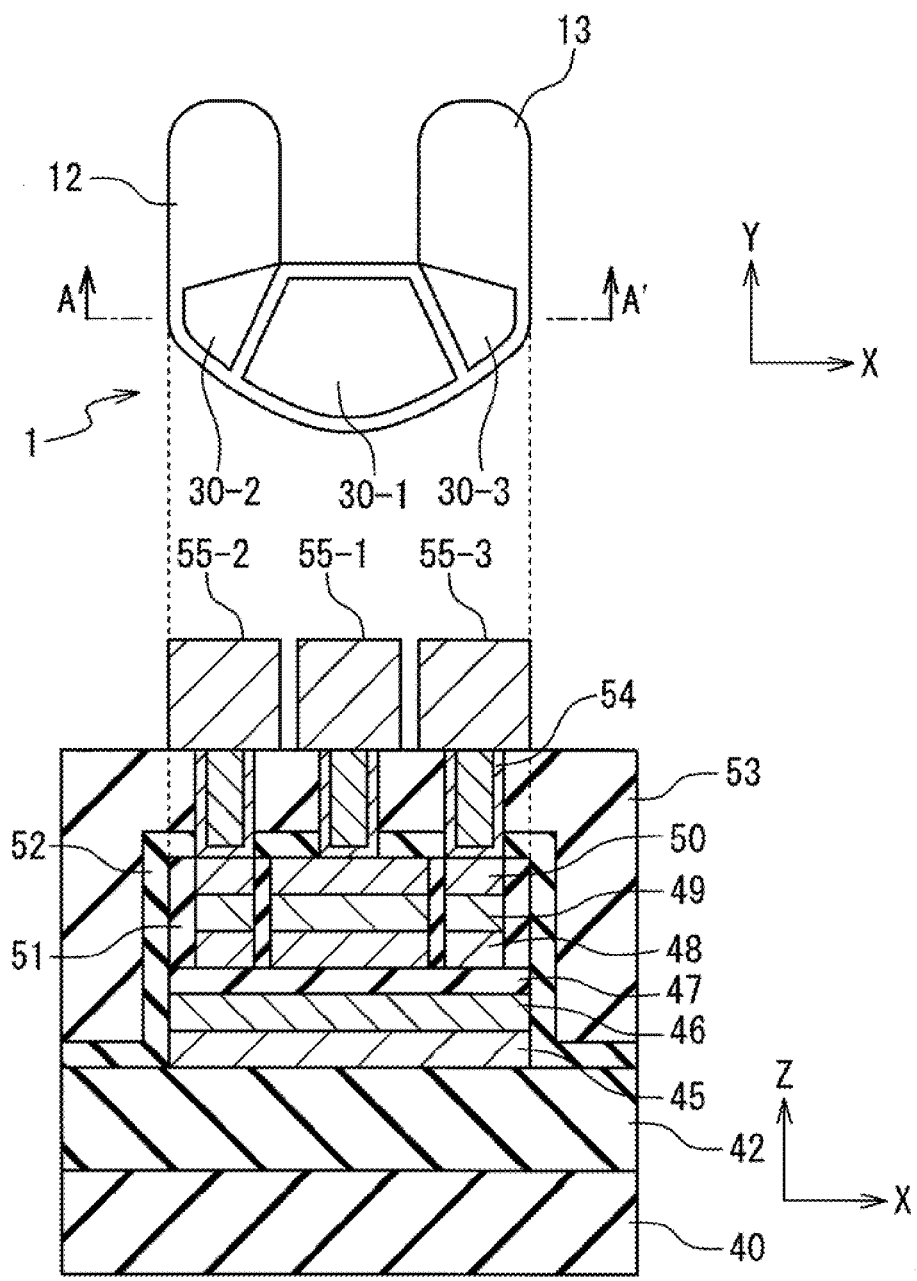
FIG. 12 is a plan view and a cross-sectional view showing a structure of the magnetoresistance element according to the second exemplary embodiment.

FIG. 12, which corresponds to the foregoing FIG. 7, shows one example of a plan-view structure and cross-sectional structures of the magnetoresistance element 1 according to the present exemplary embodiment. Only a cross-sectional structure along a line A-A' in the figure is shown. One example of a method of manufacturing the magnetoresistance element 1 according to the present exemplary embodiment will be described with reference to FIG. 12.

As in the case of the first exemplary embodiment, the films 45 to 50 are formed and then the annealing is performed. Next, a resist mask having a predetermined pattern is created by a photolithographic method. The predetermined pattern corresponds to planar shapes of the three magnetic bodies 30-1 to 30-3 constituting the pinned layer 30 and has a slit of about 0.25 μm corresponding to the gap 31. By using the resist mask, milling and RIE are performed so that the Ta film 50, the PtMn film 49 and the CoFe film 48 are processed to a desired planar shape. Consequently, the three magnetic bodies (pinned layer) 30-1 to 30-3 are formed.

After the resist mask is removed, the MgO film 47, the NiFe film 46 and the Ta film 45 are processed to a desired planar shape as in the case of the first exemplary embodiment. After the SiN film 52 and the interlayer insulating film 53 are blanket deposited, three Cu plugs 54 respectively associated with the three pinned layers 30-1 to 30-3 are formed. Then, a first upper interconnection 55-1, a second upper interconnection 55-2 and a third upper interconnection 55-3 are so formed as to be connected to the three Cu plugs 54, respectively.

2-2. Circuit Configuration and Operation

Figure 13:
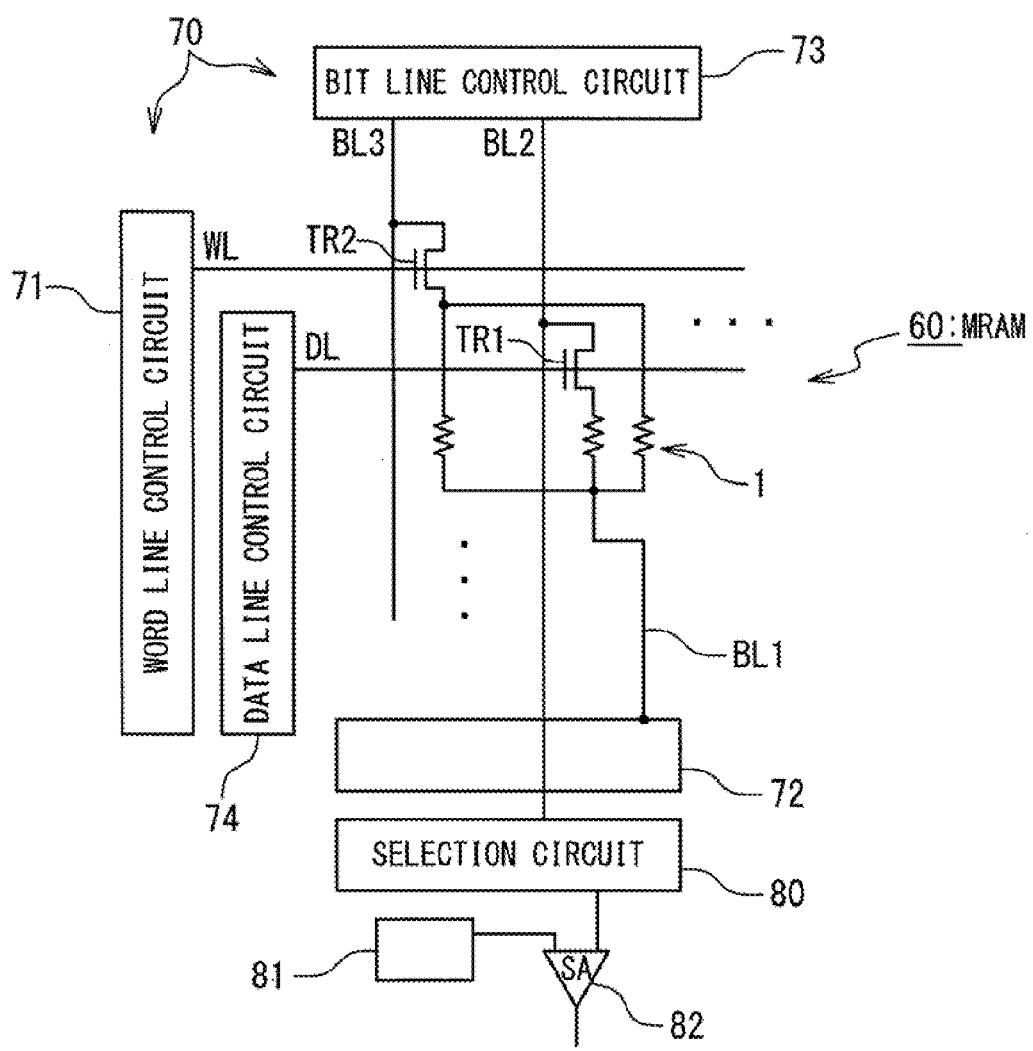
FIG. 13 is a block diagram schematically showing a circuit configuration of the MRAM according to the second exemplary embodiment.

FIG. 13 schematically shows a circuit configuration of an MRAM 60 according to the present exemplary embodiment. The MRAM 60 has a plurality of magnetoresistance elements (memory cells) 1 arranged in an array form, a word line control circuit 71, a potential application circuit 72, a bit line control circuit 73, a data line control circuit 74, a selection circuit 80, a reference potential generation circuit 81 and a differential sense amplifier 82.

The lower interconnection 41 of each magnetoresistance element 1 is connected to a first bit line BL1. The first upper interconnection 55-1 connected to the first magnetic body 30-1 is connected to a second bit line BL2 through a first selection transistor TR1. A gate of the first selection transistor TR1 is connected to a data line DL. The second upper interconnection 55-2 connected to the second magnetic body 30-2 and the third upper interconnection 55-3 connected to the third magnetic body 30-3 are connected to a third bit line BL3 through a second selection transistor TR2. A gate of the second selection transistor TR2 is connected to a word line WL. The word line WL is connected to the word line control circuit 71. The data line DL is connected to the data line control circuit 74. The first bit line BL1 is connected to the potential application circuit 72. The second bit line BL2 is connected to the bit line control circuit 73 and the selection circuit 80. The third bit line BL3 is connected to the bit line control circuit 73. An extending direction of the word line WL and the data line DL and an extending direction of the bit lines BL1 to BL3 are perpendicular to each other.

A data write operation is as follows. The data line control circuit 74 drives a target data line DL to turn ON the first selection transistor TR1. The word line control circuit 71 drives a target word line WL to turn ON the second selection transistor TR2. The potential application circuit 72 and the bit line control circuit 73 apply a predetermined potential difference between a target first bit line BL1 and target second and third bit lines BL2 and BL3. As a result, the write current (e.g. 1 mA) flows between the free layer 10 and all of the first to third magnetic bodies 30-1 to 30-3. The domain wall DW is transferred between the region covered by the first magnetic body 30-1 and the region covered by the second magnetic body 30-2 and also between the region covered by the first magnetic body 30-1 and the region covered by the third magnetic body 30-3.

Note that a direction of the write current flowing between the free layer 10 and the first magnetic body 30-1 is the same as a direction of the write current flowing between the free layer 10 and the second and third magnetic bodies 30-2 and 30-3. The potential application circuit 72 and the bit line control circuit 73 control the direction of the write current depending on the write data. It can be said that the word line control circuit 71, the potential application circuit 72, the bit line control circuit 73 and the data line control circuit 74 constitute a "current supply section 70" for supplying the current to the magnetoresistance element 1.

A data read operation is as follows. The data line control circuit 74 drives a target data line DL to turn ON the first selection transistor TR1. The second selection transistor TR2 is maintained at OFF. The potential application circuit 72 sets a potential of a target first bit line BL1 to 0 V. The bit line control circuit 73 applies a predetermined read current (e.g. 20 μA) from a target second bit line BL2 to the first bit line BL1 through the magnetoresistance element 1. The read current flows only between the free layer 10 and the first magnetic body 30-1 and does not flow through the second and third magnetic bodies 30-2 and 30-3. As in the case of the first exemplary embodiment, the selection circuit 80 connects the target second bit line BL2 with the sense amplifier 82. The sense amplifier 82 makes a comparison between the potential of the second bit line BL2 and the reference potential to sense the data.

At the time of data reading, as described above, the read current does not flow between the free layer 10 and the magnetic bodies 30-2 and 30-3 overlapping with the boundaries B1 and B2. That is to say, the spin transfer does not occur between the magnetic bodies 30-2, 30-3 and the domain wall DW stabilized at the boundary B1 or B2. As a result, erroneous writing at the time of data reading can be suppressed. Moreover, the read current can be designed larger as compared with the first exemplary embodiment. In this case, it is possible to sufficiently sense the data even if the resistance value of the magnetoresistance element 1 is designed smaller. It is therefore possible to reduce a size of the magnetoresistance element 1.

It should be noted that an arrangement of the plurality of magnetoresistance elements 1 as shown in FIG. 10 is possible also in the present exemplary embodiment.

2-3. Modified Example

Figure 14:
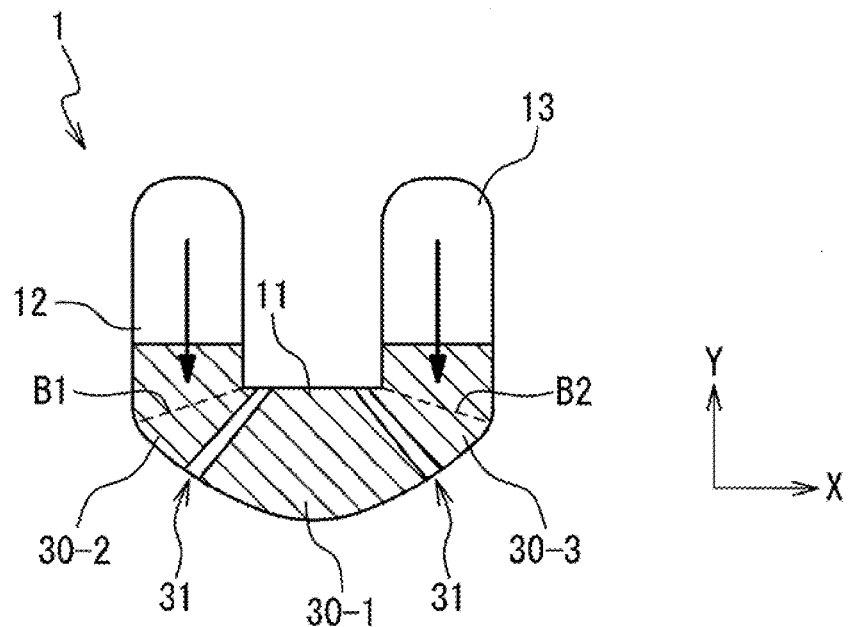
FIG. 14 is a plan view showing a modified example of the magnetoresistance element according to the second exemplary embodiment.

FIG. 14 is a plan view showing a modified example of the magnetoresistance element 1 according to the present exemplary embodiment. In FIG. 14, the three magnetic bodies 30-1 to 30-3 constituting the pinned layer 30 cover the free layer 10 up to its side ends. In particular, the magnetization switching region 11 of the free layer 10 except for the portion under the gap 31 is completely covered by the pinned layer 30. In this case, an effect that an injection efficiency of the spin electrons is improved can be obtained.

Figure 15:
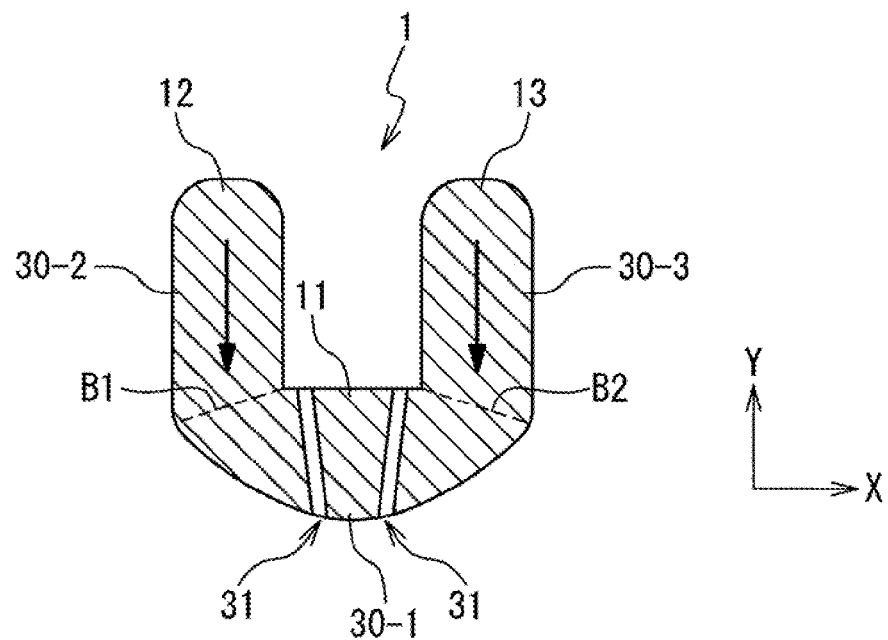
FIG. 15 is a plan view showing another modified example of the magnetoresistance element according to the second exemplary embodiment.

FIG. 15 is a plan view showing a modified example of the magnetoresistance element 1 according to the present exemplary embodiment. In FIG. 15, the three magnetic bodies 30-1 to 30-3 constituting the pinned layer 30 cover the free layer 10 up to its ends. That is, the free layer 10 except for the portion under the gap 31 is completely covered by the pinned layer 30. In this case also, the effect that the injection efficiency of the spin electrons is improved can be obtained.

Figure 16A:
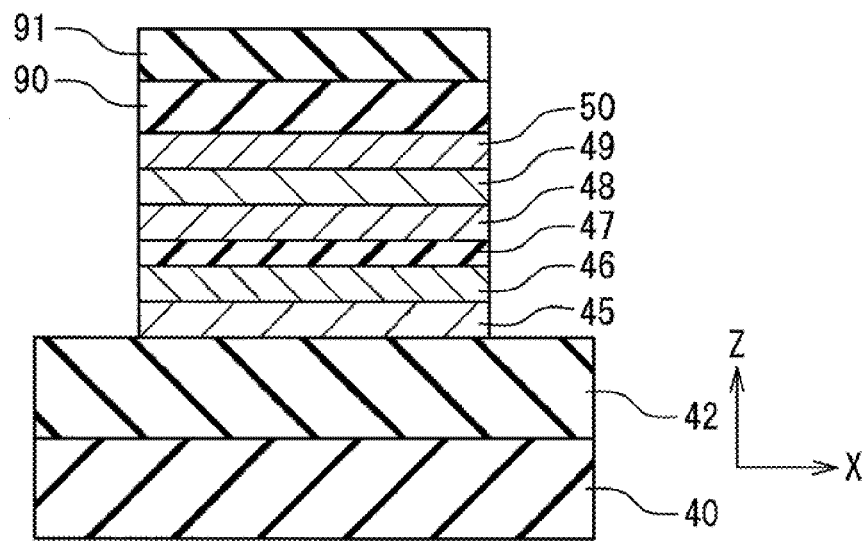
FIG. 16A is a cross-sectional view showing one example of a method of manufacturing the magnetoresistance element according to the second exemplary embodiment.
Figure 16B:
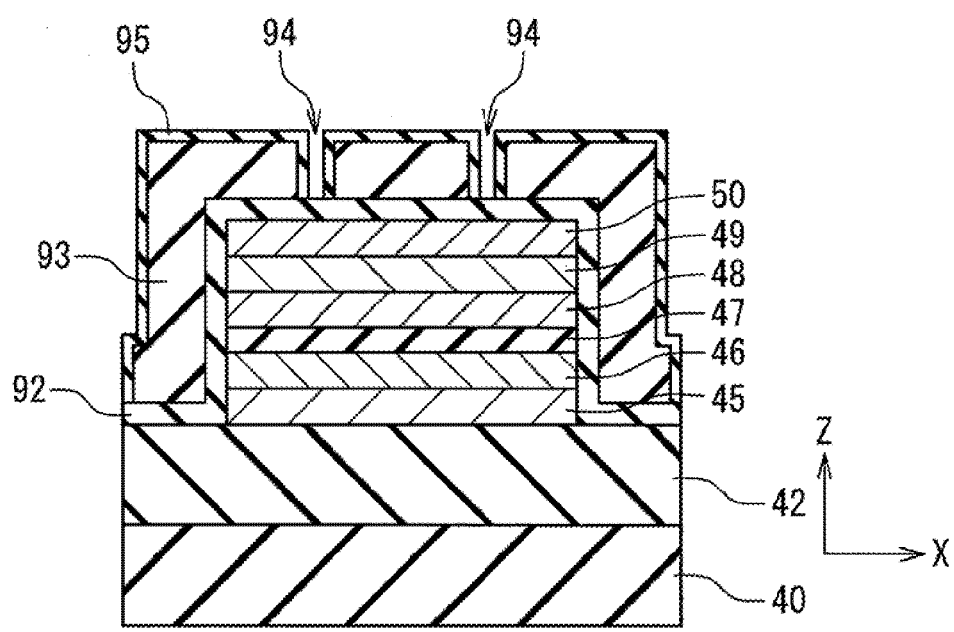
FIG. 16B is a cross-sectional view showing the one example of the method of manufacturing the magnetoresistance element according to the second exemplary embodiment.

FIGS. 16A and 16B are cross-sectional views for explaining a processing method for narrowing the gap 31. The films 45 to 50 are formed as in the case of FIG. 12. After that, a SiN film 90 (20 nm) and a SiO$_2$ film 91 (200 nm) are further blanket deposited as shown in FIG. 16A. After that, the annealing for fixing the magnetization direction of the pinned layer is performed.

Next, a resist mask having a pattern of the planar shape of the free layer 10 is formed by a photolithographic method. The SiO$_2$ film 91 is processed by RIE by the use of the resist mask. After the resist mask is removed, milling using the SiO$_2$ film 91 as a mask is performed to process from the SiN film 90 to the Ta film 45 (see FIG. 16A).

Next, after the SiO$_2$ film 91 and the SiN film 90 are removed, a SiN film 92 (20 nm) is blanket deposited as shown in FIG. 16B. Furthermore, a SiO$_2$ film 93 (200 nm) is blanket deposited. Subsequently, a resist mask having a pattern corresponding to the planar shapes of the three magnetic bodies 30-1 to 30-3 is formed by a photolithographic method. The SiO$_2$ film 93 is processed by RIE by the use of the resist mask. Thus, an opening 94 is formed. After that, the resist mask is removed.

Next, a SiO$_2$ film 95 (20 nm) is blanket deposited. At this time, the SiO$_2$ film 95 is formed on a side surface of the SiO$_2$ film 93 and hence a size of the opening 94 is reduced. After that, milling is performed such that the Ta film 50, the PtMn film 49 and the CoFe film 48 are processed until the MgO film 47 under the opening 94 is exposed. Thus, the three magnetic bodies 30-1 to 30-3 are created. The gap 31 formed at this time corresponds to the opening 94. Since the size of the opening 94 is reduced as described above, the width of the gap 31 also becomes smaller. Therefore, the transfer of the domain wall DW at the magnetization switching region 11 under the gap 31 can be achieved smoothly.

The processing method described above is applicable irrespective of the pattern of the three magnetic bodies 30-1 to 30-3.

3. THIRD EXEMPLARY EMBODIMENT

Figure 17:
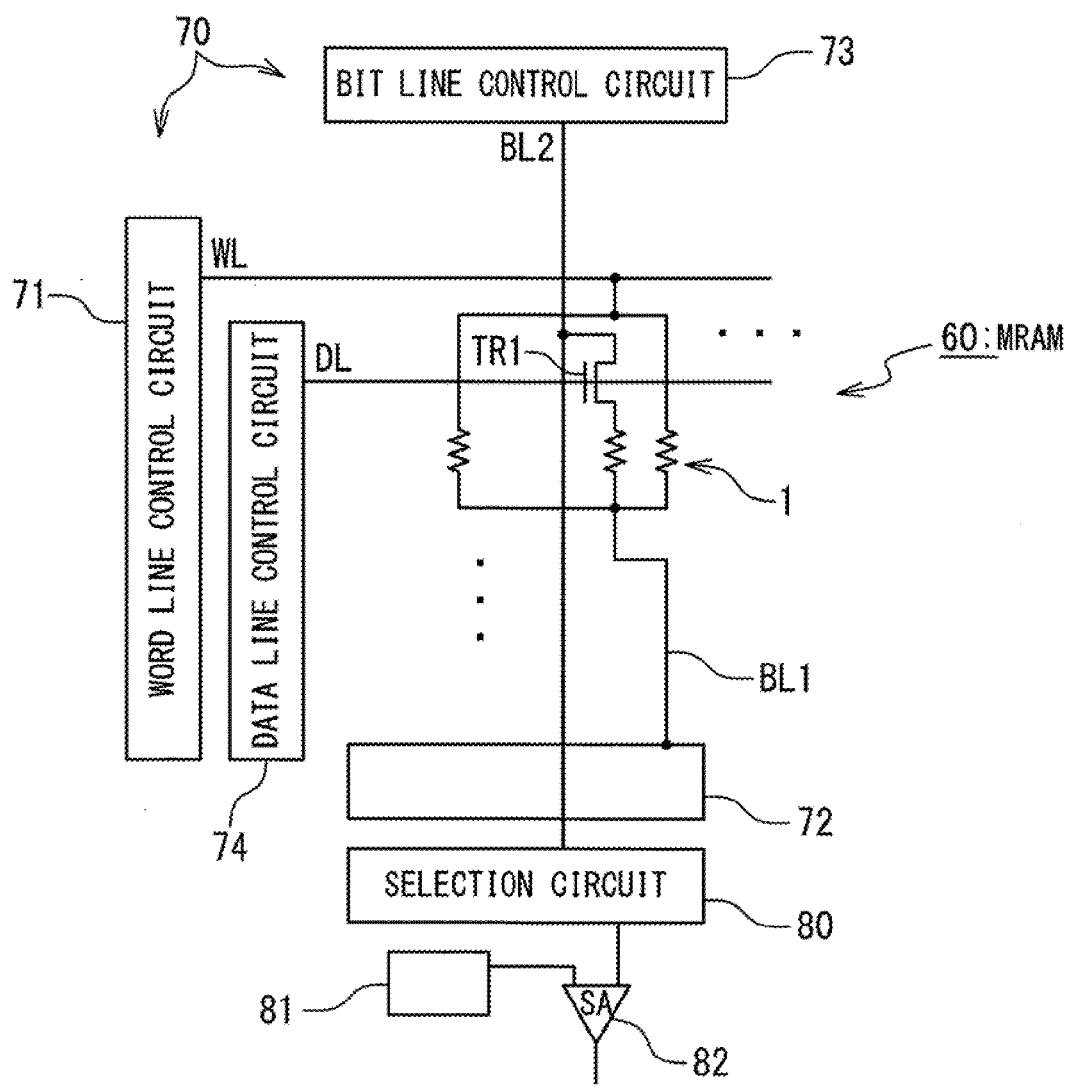
FIG. 17 is a block diagram schematically showing a circuit configuration of the MRAM according to a third exemplary embodiment.

FIG. 17 schematically shows a circuit configuration of an MRAM 60 according to a third exemplary embodiment. The circuit configuration shown in FIG. 17 does not have the second selection transistor TR2 and the third bit line BL3, as compared with the circuit configuration of the second exemplary embodiment shown in FIG. 13. The second upper interconnection 55-2 connected to the second magnetic body 30-2 and the third upper interconnection 55-3 connected to the third magnetic body 30-3 are connected to the word line WL. The other configuration is the same as in the second exemplary embodiment.

A data write operation is as follows. The data line control circuit 74 drives a target data line DL to turn ON the first selection transistor TR1. The potential application circuit 72 and the bit line control circuit 73 apply a predetermined potential difference between a target first bit line BL1 and a target second bit line BL2. Also, the word line control circuit 71 and the potential application circuit 72 apply a predetermined potential difference between a target word line WL and the target first bit line BL1. For example, a potential of 0.5 V is applied to all the first bit lines BL1. Also, potential of 0 V or 1 V is applied to the target word line WL and the target second bit line BL2. The potential of 0.5 V that is the same as that of the first bit line BL1 is applied to the non-target word lines WL and second bit lines BL2.

As a result, the write current (e.g. 1 mA) flows between the free layer 10 and all of the first to third magnetic bodies 30-1 to 30-3 in the target magnetoresistance element 1. Consequently, the magnetization switching is achieved as in the case of the second exemplary embodiment.

The target word line WL to which the potential of 0 V or 1 V is applied is connected to non-target magnetoresistance elements 1. In such a non-target magnetoresistance element 1, a current flows between the free layer 10 and the second and third magnetic bodies 30-2 and 30-3. However, no current flows between the free layer 10 and the first magnetic body 30-1. Therefore, the domain wall DW does not move between the boundary B1 and the boundary B2. That is to say, the data writing does not occur in the non-target magnetoresistance elements 1.

A data read operation is similar to that in the second exemplary embodiment.

According to the present exemplary embodiment, the second selection transistor TR2 and the third bit line BL3 are omitted from the circuit configuration of the second exemplary embodiment. Therefore, miniaturization of the memory cell is possible. The circuit configuration according to the present exemplary embodiment is preferable from a view point of the large-capacity MRAM 60.

4. FOURTH EXEMPLARY EMBODIMENT

4-1. Structure

Figure 18:
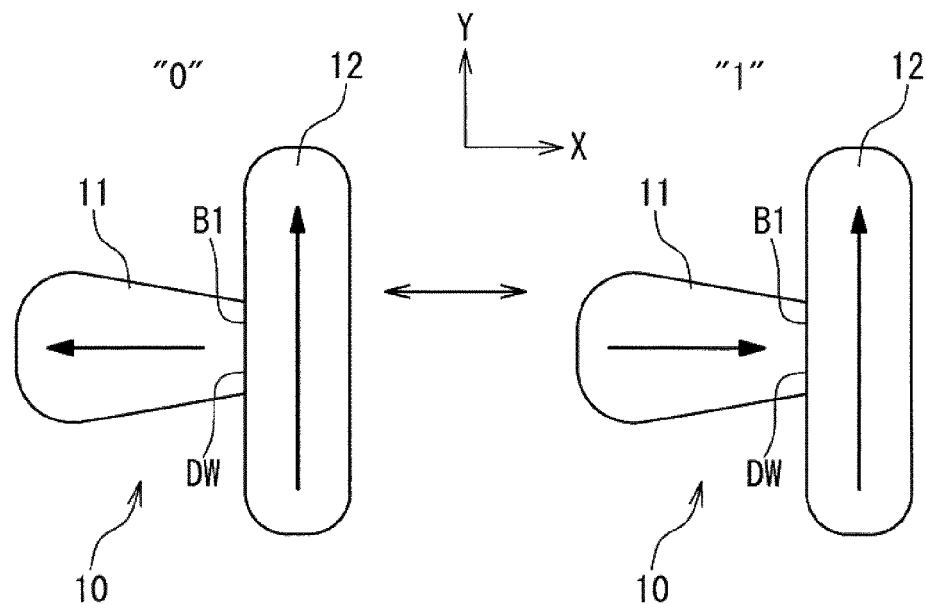
FIG. 18 is a plan view showing a structure of a free layer of the magnetoresistance element according to a fourth exemplary embodiment of the present invention.

FIG. 18 shows a planar shape of the free layer 10 of the magnetoresistance element 1 in a fourth exemplary embodiment. In the present exemplary embodiment, the free layer 10 includes one magnetization fixed region 12 in addition to the magnetization switching region 11. The magnetization fixed region 12 is connected to one end B1 of the magnetization switching region 11. The magnetization easy axis of the magnetization switching region 11 is along the X direction, and a magnetization easy axis of the magnetization fixed region 12 is along the Y direction. In FIG. 18, the free layer 10 has a T-shape, and the magnetization switching region 11 and the magnetization fixed region 12 are at right angles to each other at the one end B1.

Magnetization of the magnetization fixed region 12 is fixed in a direction parallel to the Y direction. In FIG. 18, the magnetization direction of the magnetization fixed region 12 is fixed in the +Y direction. The magnetization direction of the magnetization fixed region 12 can be fixed, for example, by applying an external magnetic field of about 500 Oe in the +Y direction at the time of device manufacturing.

A case where the magnetization direction of the magnetization switching region 11 is in the −X direction is related to data "0", while a case where it is in the +X direction is related to data "1". In either case, the domain wall DW is formed at the boundary B1 between the magnetization switching region 11 and the magnetization fixed region 12. That is to say, the domain wall DW steadily exists at the boundary B1 according to the present exemplary embodiment. It is preferable that a cross-sectional area of the free layer 10 continuously increases from the boundary B1 to a predetermined position in the magnetization switching region 11 such that the energy of the domain wall DW takes a local minimum value at the boundary B1. As a result, the domain wall DW is stabilized at the boundary B1.

The pinned layer 30 (not shown) is so formed as to overlap with at least a part of the magnetization switching region 11 and the boundary B1. In the present exemplary embodiment, for example, a planar shape of the pinned layer 30 is almost the same as the planar shape of the free layer 10 shown in FIG. 18.

The cross-sectional structure and manufacturing method of the magnetoresistance element 1 according to the present exemplary embodiment are similar to those in the first exemplary embodiment.

4-2. Circuit Configuration and Operation

A circuit configuration of the MRAM 60 according to the present exemplary embodiment is similar to the circuit configuration according to the first exemplary embodiment shown in FIG. 8. The write operation and the read operation also are similar to those in the first exemplary embodiment.

Figure 19:
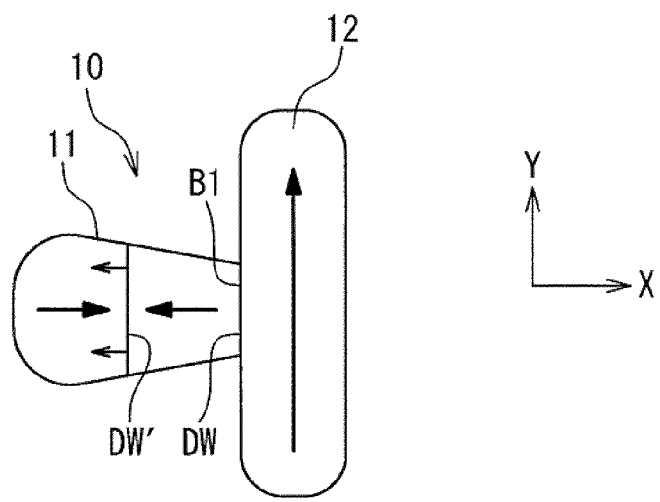
FIG. 19 is a plan view for explaining domain wall motion in the fourth exemplary embodiment.

FIG. 19 is a plan view for explaining motion of the domain wall DW in the present exemplary embodiment. As an example, let us consider a case of the transition from data "1" to data "0". When the spin electrons are injected, the magnetization reversal starts from the boundary B1 where the domain wall DW exists. Therefore, the magnetization direction of the magnetization switching region 11 in the vicinity of the boundary B1 is reversed from the +X direction to the −X direction. Here, a region where the magnetization direction is already reversed to the −X direction and a region where the magnetization direction is still in the +X direction both exist within the magnetization switching region 11. That is, a new domain wall DW' appears in the magnetization switching region 11. At this time, the domain wall DW still exists at the boundary B1.

When the spin electrons are further injected, the above-mentioned domain wall DW' moves toward the −X direction within the magnetization switching region 11. Then, when the domain wall DW' reaches the other end of the magnetization switching region 11, it disappears. In this manner, the domain wall DW' goes through the magnetization switching region 11 while the domain wall DW exists at the boundary B1, according to the present exemplary embodiment. Consequently, the magnetization direction of the magnetization switching region 11 is switched. The same applies to the transition from data "0" to data "1".

According to the present exemplary embodiment, there is no need to provide two sites for trapping the domain wall DW. The magnetization reversal can be achieved by the one magnetization fixed region 12. Therefore, miniaturization of the memory cell is possible, which is preferable from a view point of the large-capacity MRAM 60.

4-3. Modified Example

Figure 20:
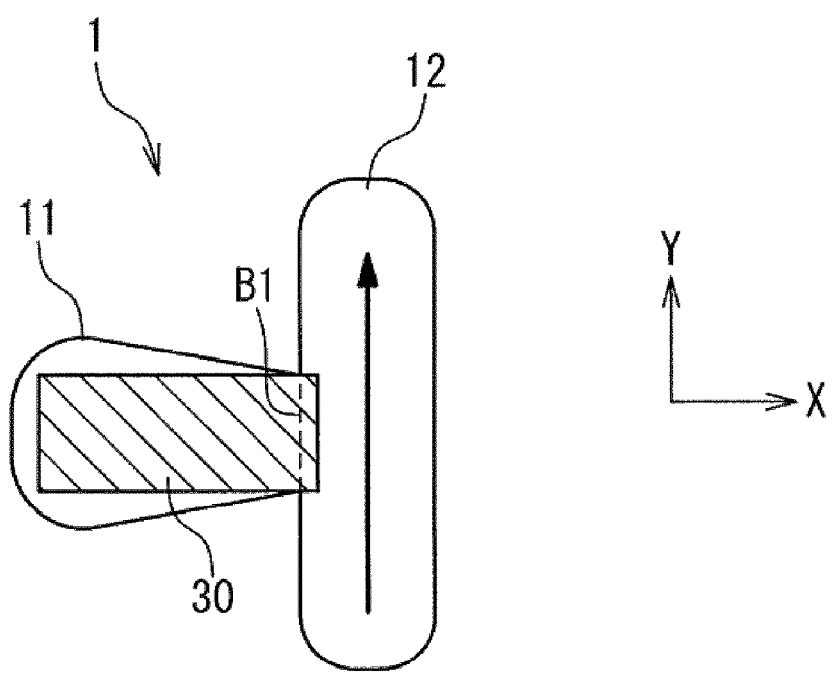
FIG. 20 is a plan view showing a modified example of the magnetoresistance element according to the fourth exemplary embodiment.

There is no need for the pinned layer 30 to have the same planar shape as the free layer 10. As show in FIG. 20, the pinned layer 30 may cover parts of the magnetization switching region 11, the magnetization fixed region 12 and the boundary B1. In this case, a total amount of the write current can be reduced. Moreover, the write current flowing in the magnetization fixed region 12 can be reduced.

Figure 21:
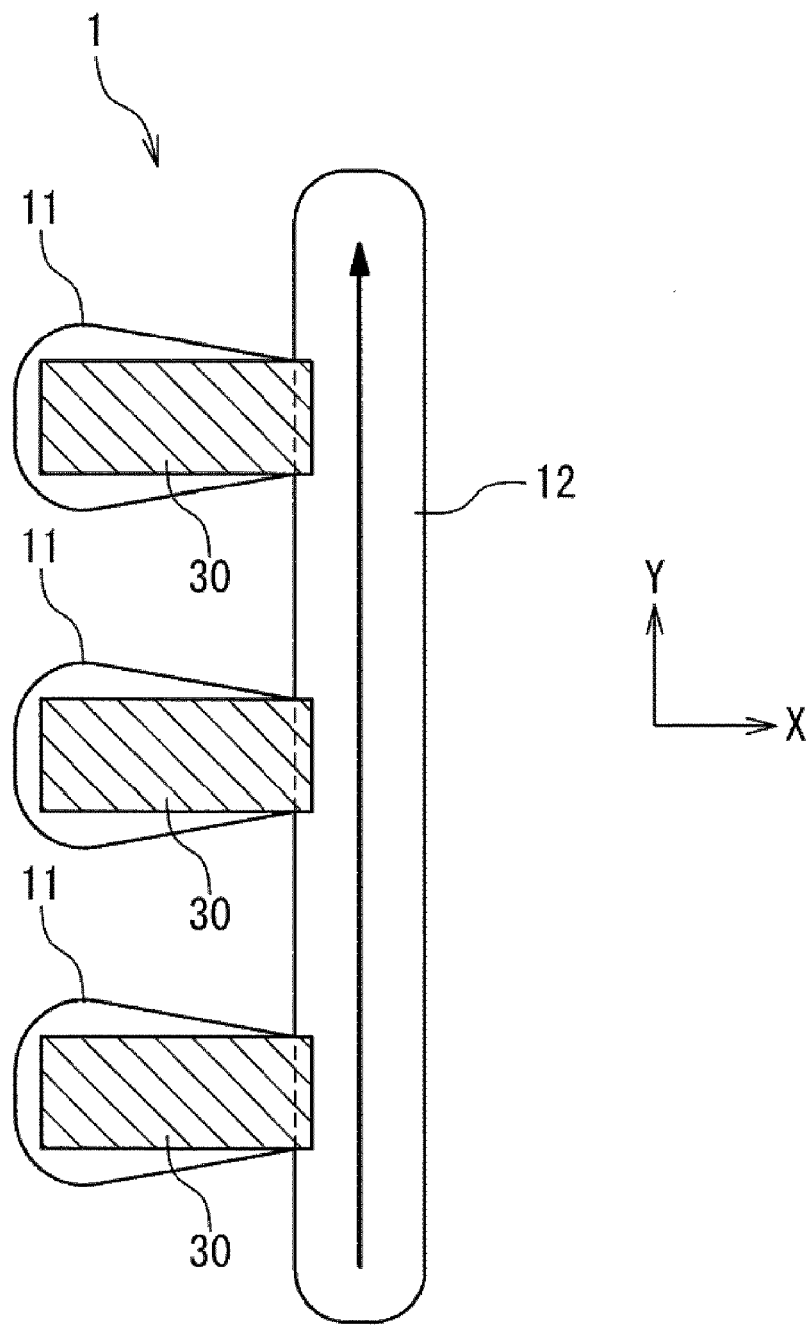
FIG. 21 is a plan view showing another modified example of the magnetoresistance element according to the fourth exemplary embodiment.

Moreover, since respective free layers 10 of the plurality of magnetoresistance elements 1 arranged in the bit line direction have a common potential, it is possible to interconnect those free layers 10. In a case where the free layer 10 of each magnetoresistance element 1 have the T-shape and the pinned layer 30 covers a part of the free layer 10, for example, an arrangement as shown in FIG. 21 is possible. In FIG. 21, the magnetization fixed region 12 is shared by the magnetoresistance elements 1 which are adjacent to each other in the bit line direction. As a result, integration of the memory cells is improved.

5. FIFTH EXEMPLARY EMBODIMENT

5-1. Structure

Figure 22:
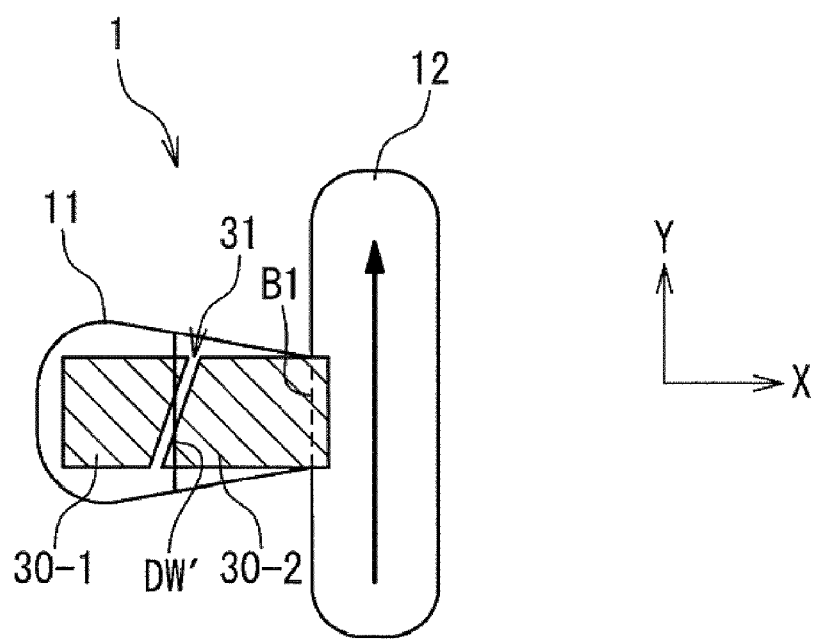
FIG. 22 is a plan view showing a structure of the magnetoresistance element according to a fifth exemplary embodiment of the present invention.

The pinned layer 30 in the fourth exemplary embodiment can be divided into a plurality of magnetic bodies, similarly to the relationship between the first exemplary embodiment and the second exemplary embodiment. FIG. 22 is a plan view showing a structure of the magnetoresistance element 1 according to a fifth exemplary embodiment of the present invention. In the present exemplary embodiment, the same reference numerals are given to the same components as those described in the fourth exemplary embodiment, and an overlapping description will be omitted as appropriate.

According to the present exemplary embodiment, the pinned layer 30 is divided into a plurality of magnetic bodies. In FIG. 22, for example, the pinned layer 30 consists of a first magnetic body 30-1 and a second magnetic body 30-2. The first magnetic body 30-1 overlaps with a part of the magnetization switching region 11 of the free layer 10. The second magnetic body 30-2 overlaps with the boundary B1 between the magnetization switching region 11 and the magnetization fixed region 12. The first magnetic body 30-1 does not overlap with the boundary B1.

A gap 31 is formed between the first magnetic body 30-1 and the second magnetic body 30-2. A width of the gap 31 is about 0.25 μm, for example. It is desirable that an extending direction of the gap 31 is different from an extending direction of the domain wall DW' such that the spin electrons are continuously supplied to the domain wall DW'.

The cross-sectional structure and manufacturing method of the magnetoresistance element 1 according to the present exemplary embodiment are similar to those in the second exemplary embodiment.

5-2. Circuit Configuration and Operation

Figure 23:
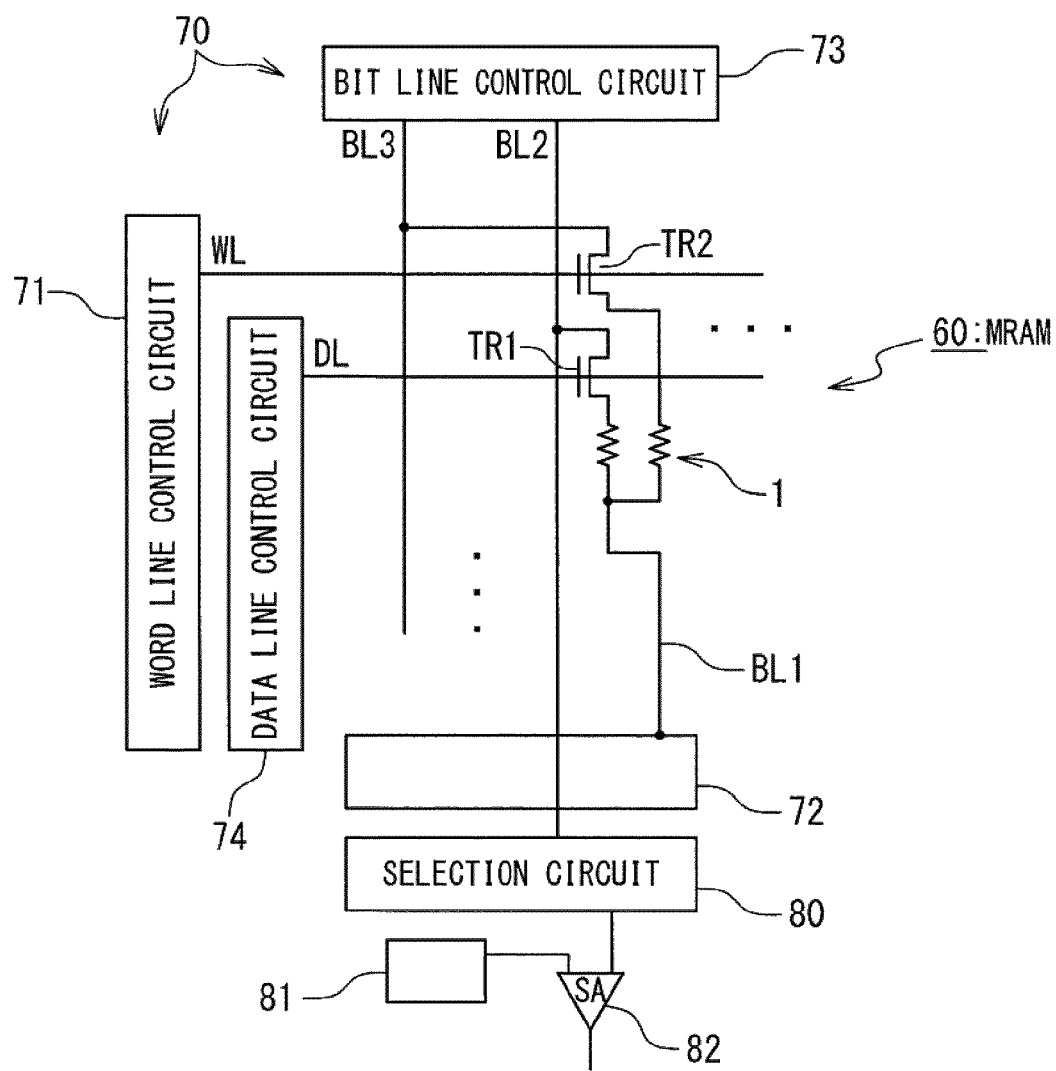
FIG. 23 is a block diagram schematically showing a circuit configuration of the MRAM according to the fifth exemplary embodiment.

FIG. 23 schematically shows a circuit configuration of an MRAM 60 according to the present exemplary embodiment. The circuit configuration according to the present exemplary embodiment is almost similar to the circuit configuration according to the second exemplary embodiment shown in FIG. 13. However, the second selection transistor TR2 is connected to the second upper interconnection 55-2 connected to the second magnetic body 30-2. That is to say, the second magnetic body 30-2 is connected to the third bit line BL3 through the second selection transistor TR2. The other circuit configuration is similar to that in second exemplary embodiment.

A data write operation is similar to that in the second exemplary embodiment. The write current flows between the free layer 10 and all of the first and second magnetic bodies 30-1 and 30-2. The domain wall DW' is transferred between the region covered by the first magnetic body 30-1 and the region covered by the second magnetic body 30-2.

A data read operation is similar to that in the second exemplary embodiment. The read current flows between the free layer 10 and the first magnetic body 30-1 and does not flow in the second magnetic body 30-2 overlapping with the boundary B1. That is to say, the spin transfer does not occur between the second magnetic body 30-2 and the domain wall DW stabilized at the boundary B1. As a result, erroneous writing at the time of data reading can be suppressed. Moreover, the read current can be designed larger as compared with the fourth exemplary embodiment. In this case, it is possible to sufficiently sense the data even if the resistance value of the magnetoresistance element 1 is designed smaller. It is therefore possible to reduce a size of the magnetoresistance element 1.

It should be noted that an arrangement of the plurality of magnetoresistance elements 1 as shown in FIG. 21 is possible also in the present exemplary embodiment. The circuit configuration of the MRAM 60 as shown in FIG. 17 is also possible.

6. SIXTH EXEMPLARY EMBODIMENT

Figure 24:
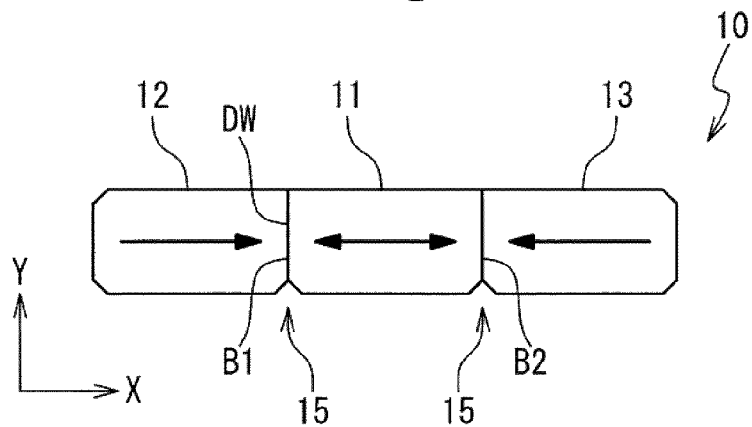
FIG. 24 is a plan view showing a structure of a free layer of the magnetoresistance element according to a sixth exemplary embodiment of the present invention.

FIG. 24 shows a planar shape of the free layer 10 of the magnetoresistance element 1 according to a sixth exemplary embodiment. Although the free layer 10 has the U-shape in the first exemplary embodiment, the free layer 10 has a linear shape in the present exemplary embodiment. More specifically, the magnetization fixed region 12 is connected to one end B1 of the magnetization switching region 11, and the magnetization fixed region 13 is connected to the other end B2 of the magnetization switching region 11. The magnetization easy axes of the magnetization switching region 11, the magnetization fixed regions 12 and 13 are all along the X direction.

The magnetizations of the magnetization fixed regions 12 and 13 are fixed in the opposite directions along the X direction. In FIG. 24, the magnetization direction of the magnetization fixed region 12 is fixed in the +X direction, and the magnetization direction of the magnetization fixed region 13 is fixed in the −X direction. In a case where the magnetization direction of the magnetization switching region 11 is in the −X direction (data "0"), the domain wall DW is formed at the boundary B1 between the magnetization switching region 11 and the magnetization fixed region 12. On the other hand, in a case where the magnetization direction of the magnetization switching region 11 is in the +X direction (data "1"), the domain wall DW is formed at the boundary B2 between the magnetization switching region 11 and the magnetization fixed region 13.

At the time of data writing, the domain wall DW moves between the boundaries B1 and B2 depending on the direction of the write current. Constricted portions 15 are provided at the positions of the boundaries B1 and B2 such that the energy of the domain wall DW takes a local minimum value at the boundaries B1 and B2. That is to say, cross-sectional areas of the magnetization switching region 11 at the boundaries B1 and B2 are smaller than a cross-sectional area thereof between the boundaries B1 and B2. Consequently, the domain wall DW is stabilized at the boundaries B1 and B2.

The pinned layer 30 (not shown) is so formed as to overlap with at least a part of the magnetization switching region 11 and the boundaries B1 and B2. For example, a planar shape of the pinned layer 30 is almost the same as the planar shape of the free layer 10 shown in FIG. 24.

The cross-sectional structure and manufacturing method of the magnetoresistance element 1 according to the present exemplary embodiment are similar to those in the first exemplary embodiment. Note that the fixation of the magnetization directions of the magnetization fixed regions 12 and 13 can be achieved, for example, by magnetostatic coupling or exchange coupling by the use of a magnetic body. Alternatively, it can be achieve by the following method. After the element is formed, the whole of the free layer 10 is magnetized in its extending direction (e.g. the +X direction). Next, the spin injection is performed with respect to only the one magnetization fixed region 13, and the magnetization of the magnetization fixed region 13 is reversed to the −X direction. Various means for performing the spin injection with respect to only the magnetization fixed region 13 can be considered. For example, a pinned layer for use in the magnetization fixation processing is independently formed to overlap with the magnetization fixed region 13. By applying a current between the pinned layer for use in the magnetization fixation processing and the magnetization fixed region 13, it is possible to reverse the magnetization of the magnetization fixed region 13 to form the domain wall DW.

A circuit configuration of the MRAM 60 according to the present exemplary embodiment is similar to the circuit configuration according to the first exemplary embodiment shown in FIG. 8. The write operation and the read operation also are similar to those in the first exemplary embodiment.

Figure 25:
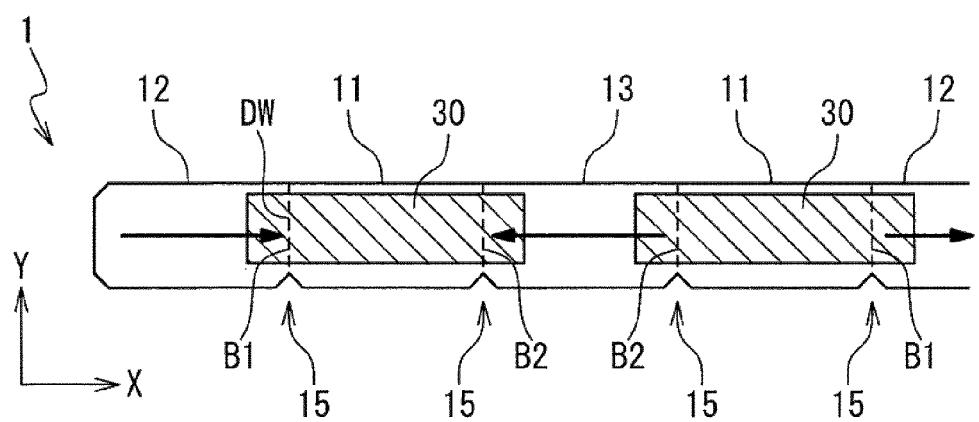
FIG. 25 is a plan view showing a modified example of the magnetoresistance element according to the sixth exemplary embodiment.

FIG. 25 is a plan view showing a modified example of the magnetoresistance element 1 according to the present exemplary embodiment. In FIG. 25, the pinned layer 30 covers parts of the magnetization switching region 11, the magnetization fixed regions 12, 13 and the boundaries B1 and B2. In this case, the write current flowing in the magnetization fixed regions 12 and 13 can be reduced. Moreover, it is also possible to interconnect respective free layers 10 of the plurality of magnetoresistance elements 1, as shown in FIG. 25. In this case, the magnetization fixed region 12 or the magnetization fixed region 13 is shared by the magnetoresistance elements 1 which are adjacent to each other. As a result, integration of the memory cells is improved.

7. SEVENTH EXEMPLARY EMBODIMENT

Figure 26:
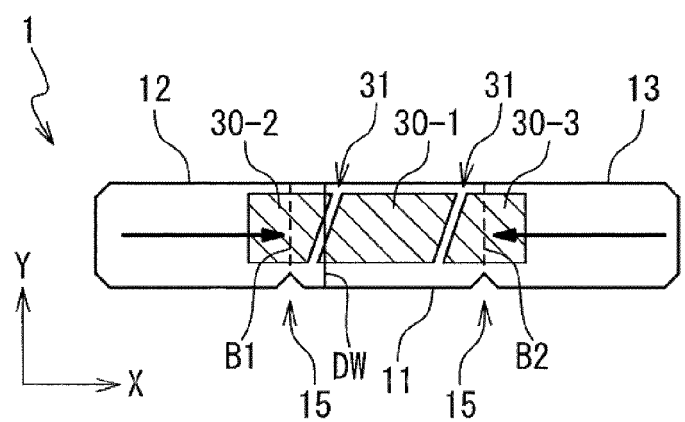
FIG. 26 is a plan view showing a structure of the magnetoresistance element according to a seventh exemplary embodiment of the present invention.

The pinned layer 30 in the sixth exemplary embodiment can be divided into a plurality of magnetic bodies, similarly to the relationship between the first exemplary embodiment and the second exemplary embodiment. FIG. 26 is a plan view showing a structure of the magnetoresistance element 1 according to a seventh exemplary embodiment of the present invention. In the present exemplary embodiment, the same reference numerals are given to the same components as those described in the sixth exemplary embodiment, and an overlapping description will be omitted as appropriate.

According to the present exemplary embodiment, the pinned layer 30 is divided into a plurality of magnetic bodies. In FIG. 26, for example, the pinned layer 30 consists of a first magnetic body 30-1, a second magnetic body 30-2 and a third magnetic body 30-3. The first magnetic body 30-1 overlaps with a part of the magnetization switching region 11 of the free layer 10. The second magnetic body 30-2 overlaps with the boundary B1 between the magnetization switching region 11 and the magnetization fixed region 12. The third magnetic body 30-3 overlaps with the boundary B2 between the magnetization switching region 11 and the magnetization fixed region 13. The first magnetic body 30-1 does not overlap with the boundaries B1 and B2.

A gap 31 is formed between the first magnetic body 30-1 and the second magnetic body 30-2. Also, a gap 31 is formed between the first magnetic body 30-1 and the third magnetic body 30-3. A width of the gap 31 is about 0.25 μm, for example. It is desirable that an extending direction of the gap 31 is different from an extending direction of the domain wall DW such that the spin electrons are continuously supplied to the domain wall DW.

The cross-sectional structure and manufacturing method of the magnetoresistance element 1 according to the present exemplary embodiment are similar to those in the second exemplary embodiment. A circuit configuration of the MRAM 60 according to the present exemplary embodiment is similar to the circuit configuration according to the second exemplary embodiment or the third exemplary embodiment. The write operation and the read operation also are similar to those in the second exemplary embodiment or the third exemplary embodiment.

8. EIGHTH EXEMPLARY EMBODIMENT

Figure 27:
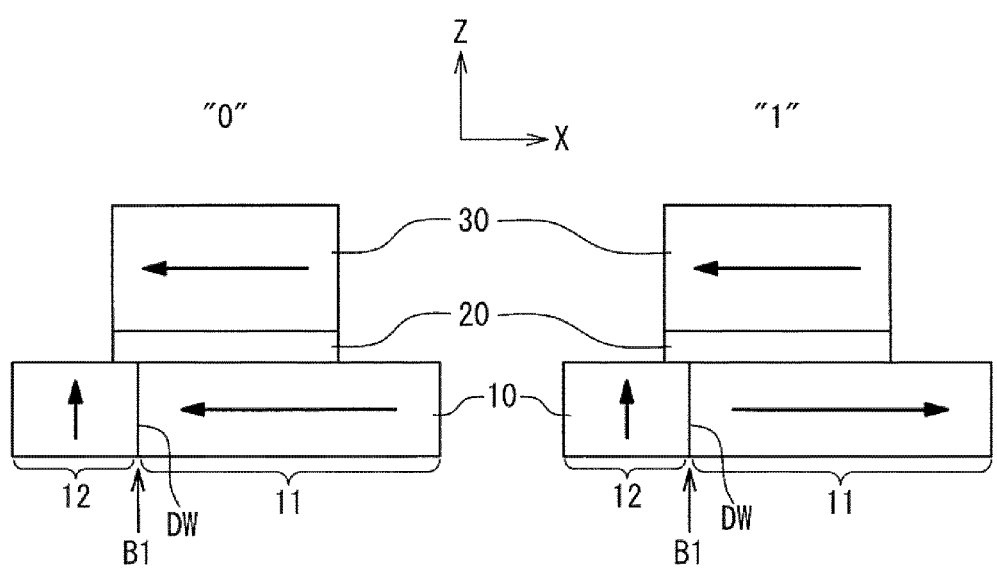
FIG. 27 is a side view showing one example of the magnetoresistance element according to an eighth exemplary embodiment of the present invention.
Figure 28:
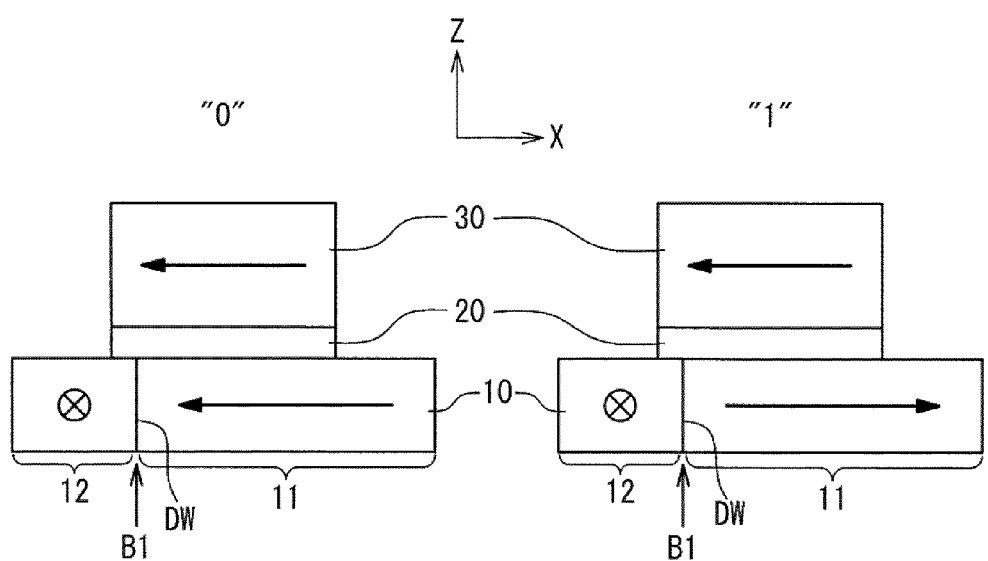
FIG. 28 is a side view showing another example of the magnetoresistance element according to the eighth exemplary embodiment.

The magnetization direction of the magnetization fixed region of the free layer 10 is not limited to those shown in the foregoing exemplary embodiments. For example, as shown in FIG. 27, the magnetization of the magnetization fixed region 12 of the free layer 10 may be fixed in the Z direction. As shown in FIG. 28, the magnetization of the magnetization fixed region 12 may be fixed in the Y direction. In these cases, the magnetization fixed region 12 whose magnetization direction is different from the X direction is connected to the magnetization switching region 11 whose magnetization direction is in the +X direction or the −X direction. Due to magnetic coupling between them, the domain wall DW is formed at one end of the magnetization switching region 11, namely at the boundary B1 between the magnetization switching region 11 and the magnetization fixed region 12. Note that in the examples shown in FIGS. 27 and 28, the domain wall DW steadily exists at the boundary B1 as in the cases of the foregoing fourth and fifth exemplary embodiments. The circuit configuration and the operation are similar to those in the fourth and fifth exemplary embodiments.

9. NINTH EXEMPLARY EMBODIMENT

In the exemplary embodiments described above, a perpendicular magnetization film instead of the in-plane magnetization film can be used as the free layer 10 and the pinned layer 30. The perpendicular magnetization film has perpendicular magnetic anisotropy and its magnetization easy axis is perpendicular to the film surface.

Figure 29:
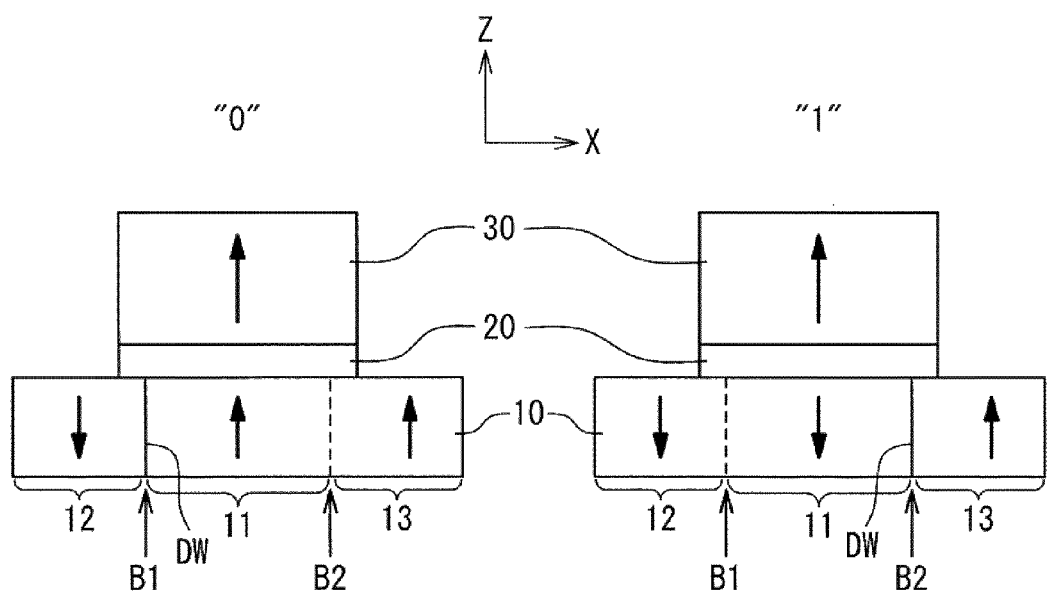
FIG. 29 is a side view showing one example of the magnetoresistance element according to a ninth exemplary embodiment of the present invention.

FIG. 29 shows an example where the perpendicular magnetization film is used as the free layer 10 and the pinned layer 30. The magnetization easy axis direction of the magnetization switching region 11 of the free layer 10 is parallel to the Z direction. That is, the magnetization direction of the magnetization switching region 11 is allowed to be the +Z direction or the −Z direction. On the other hand, the magnetization direction of the pinned layer 30 is fixed in parallel to the magnetization easy axis direction (Z direction) of the magnetization switching region 11. For example, as shown in FIG. 29, the magnetization direction of the pinned layer 30 is fixed in the +Z direction. A case (parallel state) where the magnetization direction of the magnetization switching region 11 is in the +Z direction is related to data "0". On the other hand, a case (anti-parallel state) where the magnetization direction of the magnetization switching region 11 is in the −Z direction is related to data "1".

Moreover, the free layer 10 has the domain wall DW. More specifically, the free layer 10 has the magnetization fixed regions 12 and 13 in addition to the magnetization switching region 11. In FIG. 29, the magnetization direction of the magnetization fixed region 12 is fixed in the −Z direction, and the magnetization direction of the magnetization fixed region 13 is fixed in the +Z direction. Therefore, in the case (data "0") where the magnetization direction of the magnetization switching region 11 is in the +Z direction, the domain wall DW is formed at the boundary B1 between the magnetization switching region 11 and the magnetization fixed region 12. On the other hand, in the case (data "1") where the magnetization direction of the magnetization switching region 11 is in the −Z direction, the domain wall DW is formed at the boundary B2 between the magnetization switching region 11 and the magnetization fixed region 13.

It should be noted that the structure shown in FIG. 29 is applicable to the foregoing first to third, sixth and seventh exemplary embodiments. The circuit configuration and the operation are similar to those in the first to third, sixth and seventh exemplary embodiments.

Figure 30:
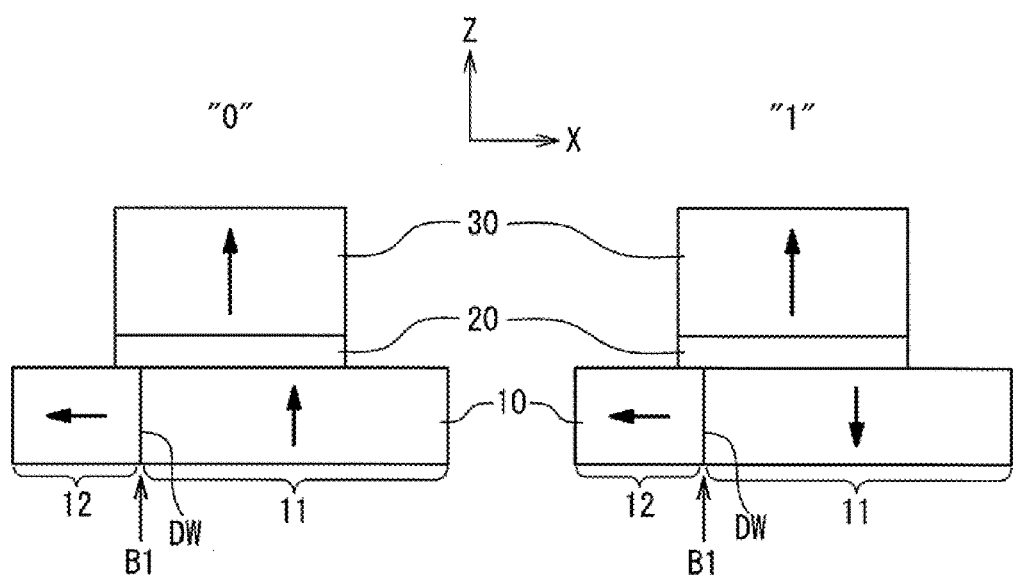
FIG. 30 is a side view showing another example of the magnetoresistance element according to the ninth exemplary embodiment.
Figure 31:
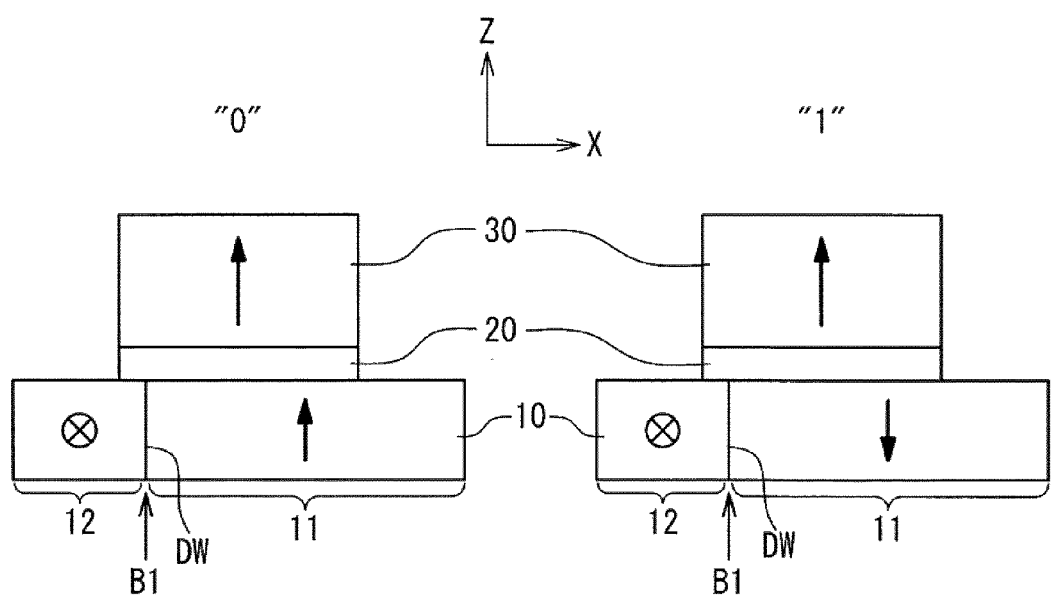
FIG. 31 is a side view showing still another example of the magnetoresistance element according to the ninth exemplary embodiment.

Also, the magnetization direction of the magnetization fixed region of the free layer 10 is not limited to that shown in FIG. 29. For example, as shown in FIG. 30, the magnetization of the magnetization fixed region 12 of the free layer 10 may be fixed in the X direction. As shown in FIG. 31, the magnetization of the magnetization fixed region 12 may be fixed in the Y direction. In these cases, the magnetization fixed region 12 whose magnetization direction is different from the Z direction is connected to the magnetization switching region 11 whose magnetization direction is in the +Z direction or the −Z direction. Due to magnetic coupling between them, the domain wall DW is formed at one end of the magnetization switching region 11, namely at the boundary B1 between the magnetization switching region 11 and the magnetization fixed region 12. Note that in the examples shown in FIGS. 30 and 31, the domain wall DW steadily exists at the boundary B1 as in the cases of the foregoing fourth and fifth exemplary embodiments. The circuit configuration and the operation are similar to those in the fourth and fifth exemplary embodiments.

10. TENTH EXEMPLARY EMBODIMENT

Figure 32:
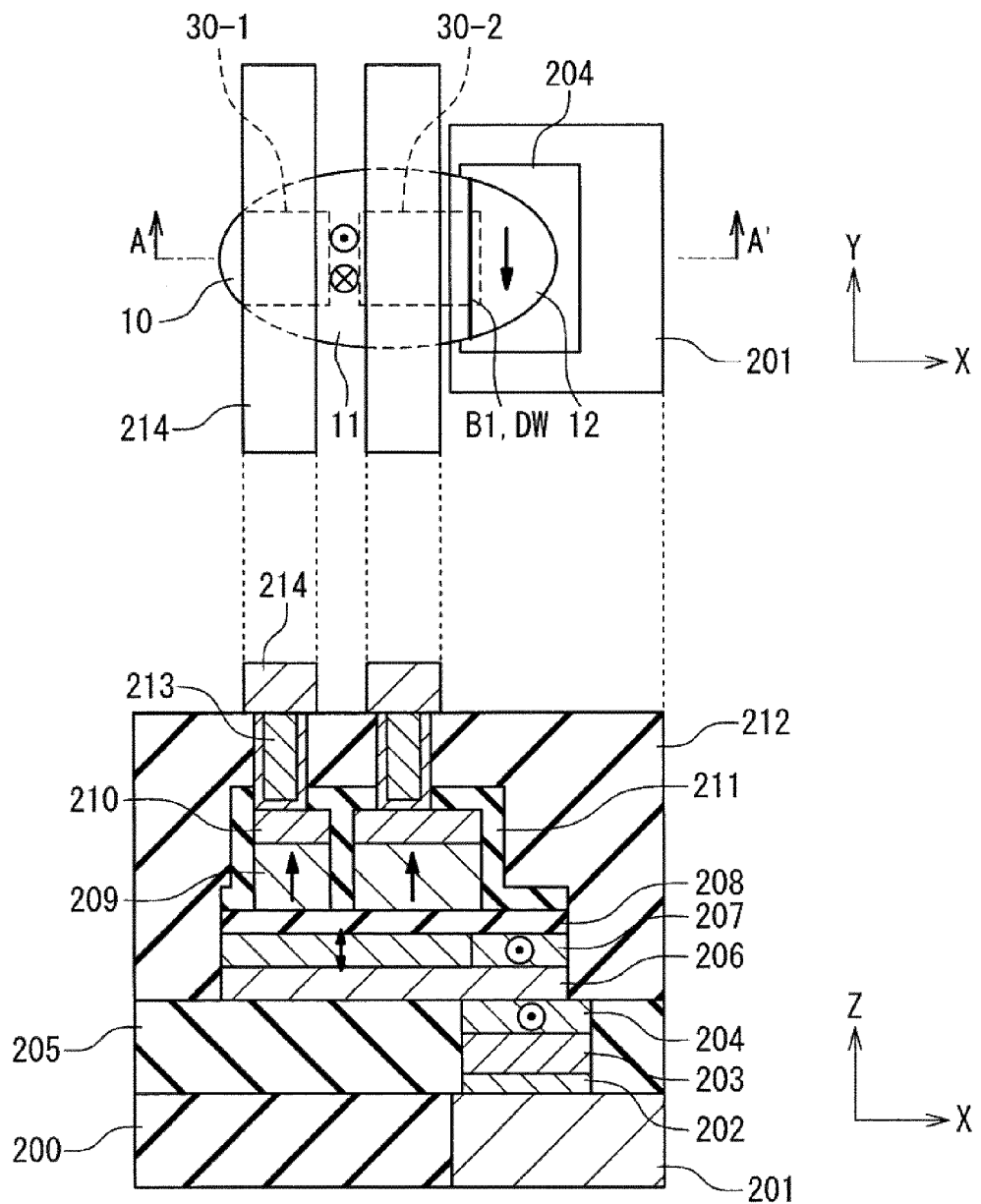
FIG. 32 is a plan view and a cross-sectional view showing a structure of the magnetoresistance element according to a tenth exemplary embodiment of the present invention.

FIG. 32 shows one example of a plan-view structure and a cross-sectional structure of the magnetoresistance element 1 according to a tenth exemplary embodiment. A cross-sectional structure along a line A-A' in the figure is shown.

According to the present exemplary embodiment, a perpendicular magnetization film (perpendicular magnetization magnetic body) is used as the pinned layer 30 and the free layer 10. Moreover, as in the case of the foregoing fifth exemplary embodiment, the pinned layer 30 is divided into a plurality of magnetic bodies. In FIG. 32, for example, the pinned layer 30 consists of a first magnetic body 30-1 and a second magnetic body 30-2. The first magnetic body 30-1 overlaps with a part of the magnetization switching region 11 of the free layer 10. The second magnetic body 30-2 overlaps with the boundary B1 between the magnetization switching region 11 and the magnetization fixed region 12. The first magnetic body 30-1 does not overlap with the boundary B1.

The free layer 10 has a shape that both ends are narrow, a central portion is wide and its width changes gradually, such as an oval shape. The second magnetic body 30-2 overlaps with the widest portion of the free layer 10.

Next, a method of manufacturing will be described below with reference to the cross-sectional view in FIG. 32. Transistors and interconnections are formed on a semiconductor substrate, and an interconnection 201 is formed in a part of an interlayer insulating film 200 on the semiconductor substrate. Next, a Ta film 202 (5 nm), a PtMn film 203 (20 nm) as an antiferromagnetic and a CoFe film 204 (30 nm) as a magnetic body are formed. Annealing is performed under a condition of temperature at 275 degrees centigrade, external magnetic field of 1 T and for 30 minutes, and thereby the magnetization direction of the CoFe film 204 is set in the Y direction. After that, the films 202 to 204 are patterned to have a square shape, 0.3 μm on a side. After a SiN film 205 (80 nm) as an interlayer insulating film is blanket deposited, CMP is performed so that a surface of the CoFe film 204 is exposed.

Next, a Ta film 206 (0.4 nm) is formed. Moreover, a CoPt film 207 (2 nm) as the perpendicular magnetization free layer 10, a MgO film 208 (1 nm) as the non-magnetic layer 20, a CoPt film 209 (20 nm) as the perpendicular magnetization pinned layer 30 and a Ta film 210 (50 nm) are formed by a sputtering method. Subsequently, the Ta film 210 is processed to a desired shape of the perpendicular magnetization pinned layer 30 by using a resist mask. After the resist mask is removed, the CoPt film 209 is processed by using the Ta film 210 as a mask. As a result, the first magnetic body 30-1 and the second magnetic body 30-2 are formed.

Next, a SiN film 211 (30 nm) is blanket deposited by a CVD method. Subsequently, the SiN film 211, the MgO film 208, the CoPt film 207 and the Ta film 206 are processed to a desired shape of the perpendicular magnetization free layer 10 by a photolithographic method.

After that, an $SiO_2$ film 212 as an interlayer insulating film is formed. Vias respectively connected to the first magnetic body 30-1 and the second magnetic body 30-2 are formed in the $SiO_2$ film 212, and Cu plugs 213 are formed in the respective vias. Further, upper interconnections 214 are formed on the respective Cu plugs 213. At the end, a magnetic field of about 1 T in the +Z direction is applied at room temperature, and thereby the magnetization direction of the CoPt film 209 as the perpendicular magnetization pinned layer 30 is set in the +Z direction.

In this manner, the magnetoresistance element 1 is formed. According to the present exemplary embodiment, the domain wall DW is formed at the position B1 due to magnetic coupling between the CoFe film 204 being the magnetic body film and the CoPt film 207 being the perpendicular magnetization free layer 10. That is, the magnetization fixed region 12 is formed in the perpendicular magnetization free layer 10 by the CoFe film 204, and thus the domain wall DW is formed at the boundary B1 between the magnetization switching region 11 and the magnetization fixed region 12.

The circuit configuration in the present exemplary embodiment is similar to that in the fifth exemplary embodiment. The data writing is achieved by applying the write current between the free layer 10 and the second magnetic body 30-2. The domain wall DW moves in the region covered by the second magnetic body 30-2 and goes across the widest portion of the free layer 10. Since the free layer 10 is getting narrower thereafter, the domain wall DW proceeds toward the end of the free layer where the domain wall formation energy becomes lower and disappears in the end. In this manner, the magnetization direction of the magnetization switching region 11 is switched. Meanwhile, the write current does not flow in the first magnetic body 30-1. In the present exemplary embodiment, the domain wall DW remains at the boundary B1 as in the case of the fifth exemplary embodiment. By changing the polarity of the write current, the magnetization direction can be controlled and different data can be written. The data reading is similar to that in the fifth exemplary embodiment.

It should be noted in the present exemplary embodiment that the magnetization direction of the CoFe film 204 may be parallel to the Y direction or may be parallel to the X direction. The CoFe film 204 may be constituted by a plurality of magnetic layers. The CoFe film 204 may have a structure including a plurality of magnetic bodies that are antiferromagnetically coupled one after another through non-magnetic body such as Ru. In this case, it is possible to cancel the magnetization of CoFe film 204 as a whole by adjusting respective thicknesses of the plurality of magnetic body layers. In other words, it is possible to cancel leakage magnetic field from the end of the CoFe film 204 and thus to suppress influence of the leakage magnetic field on the data storage section.

The exemplary embodiments of the present invention have been described above with reference to the attached drawings. However, the present invention is not limited to the above-described exemplary embodiments and can be appropriately modified by a person skilled in the art without departing from the scope of the invention.

The invention claimed is:
1. A magnetic random access memory comprising:
a magnetoresistance element; and
a current supply section configured to supply a current to said magnetoresistance element,
wherein said magnetoresistance element comprises:

a first magnetic layer including a first region whose magnetization direction is reversible;

a second magnetic layer whose magnetization direction is fixed parallel to a magnetization easy axis direction of said first region; and a non-magnetic layer sandwiched between said first magnetic layer and said second magnetic layer, wherein a domain wall is formed at at least one end of said first region of said first magnetic layer, said second magnetic layer is formed to overlap with at least a part of said first region and at least a part of said one end, and wherein when switching the magnetization direction of said first region, said current supply section applies a write current such that said write current flows between said first magnetic layer and said second magnetic layer through said non-magnetic layer, and wherein a CPP (current perpendicular to a plane) current path is provided such that a CPP write current is supplied to a domain-wall formation position.

2. The magnetic random access memory according to claim 1, wherein said first magnetic layer further includes a second region connected to the one end of said first region, a magnetization direction of said second region is fixed, and said domain wall is steadily formed at a boundary between said first region and said second region.

3. The magnetic random access memory according to claim 2, wherein a cross-sectional area of said first magnetic layer continuously increases from said boundary to a predetermined position in said first region.

4. The magnetic random access memory according to claim 2, wherein said second magnetic layer is formed to overlap with said first region and said boundary.

5. The magnetic random access memory according to claim 2, wherein said second magnetic layer comprises a plurality of magnetic bodies, wherein said plurality of magnetic bodies includes:

a first magnetic body overlapping with a part of said first region; and a second magnetic body overlapping with said boundary.

6. The magnetic random access memory according to claim 5, wherein, when switching the magnetization direction of said first region, said current supply section applies said write current between said first magnetic layer and all of said first magnetic body and said second magnetic body, and wherein, when detecting a resistance value of said magnetoresistance element, said current supply section applies a read current only between said first magnetic layer and said first magnetic body.

7. The magnetic random access memory according to claim 2, wherein said first region and said second region are at right angles to each other at said boundary.

8. The magnetic random access memory according to claim 7, further comprising another magnetoresistance element having the same structure as said magnetoresistance element, wherein said second region is shared by said magnetoresistance element and said another magnetoresistance element.

9. The magnetic random access memory according to claim 1, wherein said first magnetic layer further includes:

a second region connected to the one end of said first region; and a third region connected to the other end of said first region, wherein magnetization directions of said second region and said third region are fixed, and said domain wall is formed at a first boundary between said first region and said second region or a second boundary between said first region and said third region and moves between said first boundary and said second boundary.

10. The magnetic random access memory according to claim 9, wherein a cross-sectional area of said first region at the first and second boundaries is smaller than a cross-sectional area of said first region at other than the first and second boundaries.

11. The magnetic random access memory according to claim 9, wherein said second magnetic layer is formed to overlap with said first region and the first and second boundaries.

12. The magnetic random access memory according to claim 9, wherein said second magnetic layer comprises a plurality of magnetic bodies, wherein said plurality of magnetic bodies includes:

a first magnetic body overlapping with a part of said first region;

a second magnetic body overlapping with the first boundary between said first region and said second region; and a third magnetic body overlapping with the second boundary between said first region and said third region.

13. The magnetic random access memory according to claim 12, wherein, when switching the magnetization direction of said first region, said current supply section applies said write current between said first magnetic layer and all of said first magnetic body, said second magnetic body and said third magnetic body, and wherein, when detecting a resistance value of said magnetoresistance element, said current supply section applies a read current only between said first magnetic layer and said first magnetic body.

14. The magnetic random access memory according to claim 9, wherein said first region, said second region and said third region of said first magnetic layer are arranged to be a U-shape.

15. The magnetic random access memory according to claim 14, further comprising another magnetoresistance element having the same structure as said magnetoresistance element, wherein said second region is shared by said magnetoresistance element and said another magnetoresistance element.

16. The magnetic random access memory according to claim 1, wherein the magnetization direction of said first region of said first magnetic layer is substantially parallel to a in-plane direction of said first magnetic layer.

17. The magnetic random access memory according to claim 1,
wherein the magnetization direction of said first region of said first magnetic layer is substantially perpendicular to a in-plane direction of said first magnetic layer.

18. The magnetic random access memory according to claim 1,
wherein said domain wall in said first magnetic layer is formed by magnetic coupling between a magnetic body whose magnetization direction is substantially parallel to a in-plane direction of said first magnetic layer and a magnetic body whose magnetization direction is substantially perpendicular to a in-plane direction of said first magnetic layer.

19. The magnetic random access memory according to claim 18,
wherein said magnetic body whose magnetization direction is substantially parallel to the in-plane direction of said first magnetic layer has a structure comprising a plurality of magnetic bodies that are antiferromagnetically coupled to each other through non-magnetic body.

20. The magnetic random access memory according to claim 19,
wherein magnetization of said magnetic body whose magnetization direction is substantially parallel to the in-plane direction of said first magnetic layer is canceled as a whole.

* * * * *